(12) United States Patent
Pan et al.

(10) Patent No.: US 11,411,186 B2
(45) Date of Patent: Aug. 9, 2022

(54) BORON HETEROCYCLIC COMPOUND, DISPLAY PANEL AND DISPLAY APPARATUS

(71) Applicant: WuHan TianMa Micro-Electronics Co., Ltd., Wuhan (CN)

(72) Inventors: Longxin Pan, Wuhan (CN); Zhengchuan Zhang, Wuhan (CN); Fang Yuan, Wuhan (CN); Kun Wang, Wuhan (CN); Peng Wang, Wuhan (CN)

(73) Assignee: WuHan TianMa Micro-Electronics Co., Ltd., Wuhan (CN)

( * ) Notice: Subject to any disclaimer, the term of this patent is extended or adjusted under 35 U.S.C. 154(b) by 344 days.

(21) Appl. No.: 16/587,039

(22) Filed: Sep. 29, 2019

(65) Prior Publication Data
US 2020/0028086 A1  Jan. 23, 2020

(30) Foreign Application Priority Data
Apr. 30, 2019 (CN) .......................... 201910363184.0

(51) Int. Cl.
*H01L 51/00* (2006.01)
*C07F 5/02* (2006.01)
(Continued)

(52) U.S. Cl.
CPC ............ *H01L 51/008* (2013.01); *C07F 5/027* (2013.01); *H01L 51/0072* (2013.01);
(Continued)

(58) Field of Classification Search
CPC .... H01L 51/008; H01L 51/0071; C07F 5/027; C07F 5/02
See application file for complete search history.

(56) References Cited

U.S. PATENT DOCUMENTS

2015/0097162 A1* 4/2015 Ono ..................... H01L 51/008
257/40

* cited by examiner

*Primary Examiner* — Alexander C Kollias
(74) *Attorney, Agent, or Firm* — Kilpatrick Townsend & Stockton, LLP

(57) ABSTRACT

A boron heterocyclic compound has a structure represented by Formula (I):

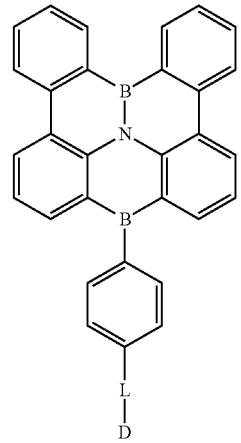

Formula (I)

in which L represents a single bond, a substituted or unsubstituted phenyl, a substituted or unsubstituted naphthyl, a substituted or unsubstituted anthryl, and D is mainly selected from carbazolyl and derivative groups thereof, acridinyl and derivative groups thereof, or diarylamino and derivative groups thereof. In the boron heterocyclic compound, an acceptor unit is bonded through a boron heterocyclic SP3 linking moi- (Continued)

ety, which shortens the conjugation length, increases the energy level, and also further improves the thermodynamic stability of the molecule. In addition, the short conjugate axis reduces intramolecular charge transfer and narrows luminescence spectrum to some extent. The compound can be used as a TADF material. Since the light-emitting layer of the light-emitting device does not contain noble metals, the cost thereof can be greatly reduced.

7 Claims, 5 Drawing Sheets

(51) Int. Cl.
*H01L 51/42* (2006.01)
*H01L 51/50* (2006.01)
(52) U.S. Cl.
CPC ...... *H01L 51/0073* (2013.01); *H01L 51/4273* (2013.01); *H01L 51/5056* (2013.01); *H01L 51/5088* (2013.01)

BORON HETEROCYCLIC COMPOUND, DISPLAY PANEL AND DISPLAY APPARATUS

CROSS-REFERENCE TO RELATED APPLICATIONS

The present application claims priority to Chinese Patent Application No. 201910363184.0, filed on Apr. 30, 2019, the content of which is incorporated herein by reference in its entirety.

TECHNICAL FIELD

The present disclosure relates to the field of organic electroluminescent materials, and in particular to a boron heterocyclic compound having thermally activated delayed fluorescence (TADF) properties, a display panel and a display apparatus including the boron heterocyclic compound.

BACKGROUND

According to categories of luminescent excitons, the organic electroluminescent devices (OLEDs) can be classified into fluorescent devices and phosphorescent devices.

Compared with the conventional fluorescent devices that emit light only by using singlet exciton energy (25%), the phosphorescent devices have broader application prospects because they can theoretically achieve 100% of internal quantum efficiency. However, the phosphorescent devices are expensive due to their high content of heavy metals (almost several times that of the fluorescent material) and also have poor stability (i.e., short service time).

In recent years, a new light-emitting material, i.e., thermally activated delayed fluorescence (TADF) material, has been studied. Upon the principle of E-type up conversion, the energy of singlet and triplet excitons can be utilized simultaneously, and the higher internal quantum efficiency can be achieved. Since such TADF materials and conventional fluorescent materials do not contain heavy metals, their cost can be greatly reduced and the stability can be improved. At present, the devices based on these materials already have a comparable external quantum efficiency (EQE) as the phosphorescent devices.

If the delayed fluorescence needs to utilize a reverse intersystem crossing (RISC) form the triplet to single state energy level to emit light, an energy difference between the singlet energy level and triplet energy level is required to be reduced to a certain value (generally, $\Delta E_{ST} \leq 0.2$ ev) to satisfy a required RISC. $\Delta E_{ST}$ and the overlap degree between HOMO and LUMO satisfy the following relationship:

$$\Delta E_{ST} = E(S) - E(T) = 2J(\phi, \phi^*)$$

$$J(\phi, \phi^*) = \left\langle \phi(1)\phi^*(2) \left| \frac{e^2}{r_{1,2}} \right| \phi(2)\phi^*(1) \right\rangle.$$

That is, $\Delta E_{ST}$ is positively correlated with the overlap degree between HOMO and LUMO. In order to reduce $\Delta E_{ST}$, it is necessary to separate HOMO from LUMO as much as possible.

As follow is shown a reported TADF material CzDBA, which realizes the separation of HOMO and LUMO by a double boron structure. Therefore, $\Delta E_{ST}$ is relatively small, HOMO and LUMO partially overlap, and thus the molecule has a high luminescence efficiency. In an OLED device, in which the green light material is used as EML, has an external quantum efficiency up to 37.8±0.6%, a current efficiency of 139.6±2.8 cd/A, and a power efficiency of 121.6±3.1 lm/W. An efficiency roll-off is only 0.3% under brightness up to 1000 cd m$^{-2}$.

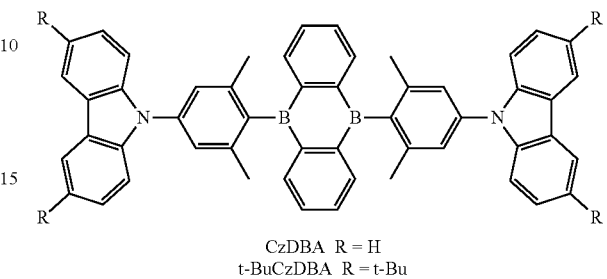

CzDBA R = H
t-BuCzDBA R = t-Bu

As a third-generation OLED material, TADF materials have the advantages of traditional fluorescent materials and phosphorescent materials at the same time, and are the popular focus of OLED research. Although more and more TADF materials have been reported so far, few of them has excellent efficiency and a small roll-off. The boron compounds exhibit some advantages and potential, but are less reported at current. Therefore, it is urgent to develop a new TADF material.

SUMMARY

In view of above, the present disclosure provides a novel electroluminescent boron heterocyclic compound having thermally activated delayed fluorescence (TADF) property, and applications of the boron heterocyclic compound in OLED.

One embodiment of the present disclosure provides a boron heterocyclic compound having a structure represented by the Formula (I):

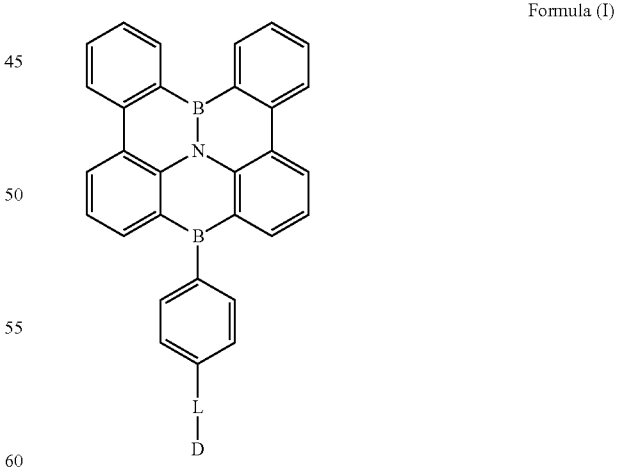

Formula (I)

L represents a single bond, a substituted or unsubstituted phenyl, a substituted or unsubstituted naphthyl, a substituted or unsubstituted anthryl;

D is selected from the group consisting of C1-C20 alkyl, C3-C20 cycloalkyl, C1-C20 alkoxy, a substituted or unsubstituted ethenyl, a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthrenyl, a substituted or unsubstituted benzanthracenyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and derivative groups thereof, acridinyl and derivative groups thereof, and diarylamino and derivative groups thereof.

Another embodiment of the present disclosure provides a display panel including an organic light-emitting device, and a light-emitting material of the organic light-emitting device includes the TADF material according to the present disclosure.

Yet another of the present disclosure provides a display apparatus including the above display panel.

DESCRIPTION OF EMBODIMENTS

Figure 1:
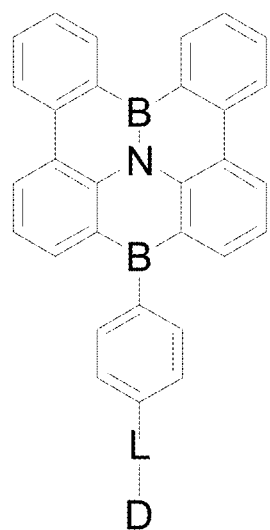
FIG. 1 is a chemical Formula of a boron heterocyclic compound according to the present disclosure.

The present disclosure is further described in the following examples and comparative examples, which are merely for illustrative purposes, but not to limit the present disclosure. Any modifications or equivalent substitutions of the embodiments of the present disclosure shall fall within the protection scope of the present disclosure.

One embodiment of the present disclosure provides a boron heterocyclic compound having a structure represented by the Formula (I):

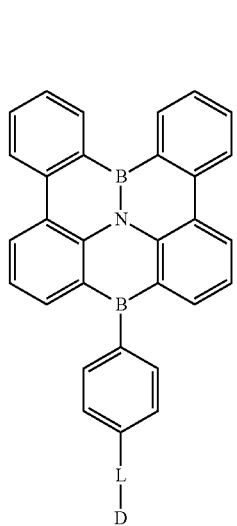

Formula (I)

where L represents a single bond, a substituted or unsubstituted phenyl, a substituted or unsubstituted naphthyl, a substituted or unsubstituted anthryl;

D is selected from the group consisting of C1-C20 alkyl, C3-C20 cycloalkyl, C1-C20 alkoxy, a substituted or unsubstituted ethenyl, a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthrenyl, a substituted or unsubstituted benzanthracenyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and derivative groups thereof, acridinyl and derivative groups thereof, and diarylamino and derivative groups thereof.

In the boron heterocyclic based TADF material provided by the present disclosure, carbazole, triphenylamine, spirobifluorene or the like are used as a P-type donor unit of a material molecule, and is bonded to an acceptor unit through a boron heterocyclic SP3 linking moiety. The boron heterocyclic SP3 linking moiety can shorten the conjugation length, increase the energy level, and further improve the thermodynamic stability of the molecule. In addition, the short conjugation axis weakens the intramolecular charge transfer and narrows luminescence spectrum to some extent.

In the boron heterocyclic compound of the present disclosure, by attaching a group having a large steric hindrance to the boron atom of the boron heterocyclic compound, aggregation of the compound molecules is avoided, thereby avoiding a π-aggregation or excimer formed by directly overlapping conjugate planes. Meanwhile, by forming a D-π-A conjugation structure, the intramolecular charge transfer is effectively enhanced, thereby improving the luminescence efficiency.

Since the material according to the present disclosure has TADF property, the triplet exciton, which are blocked in molecular transition of the conventional fluorescent material, can be used to emit light, thereby improving the efficiency of device. The reason is in that the designed molecule has a relatively small $\Delta E_{ST}$, which satisfies the reverse intersystem crossing (RISC) from the triplet energy to the singlet state, thereby improving the luminescence efficiency.

The TADF material itself is bipolar, and thus can greatly improve the injection and transmission of two kinds of carriers when it is used as a light-emitting layer, thereby reducing the device voltage. In addition, since the light-emitting layer of the device does not contain noble metals, the cost thereof can be greatly reduced.

According to one embodiment of the boron heterocyclic compound of the present disclosure, D is any one of the following groups:

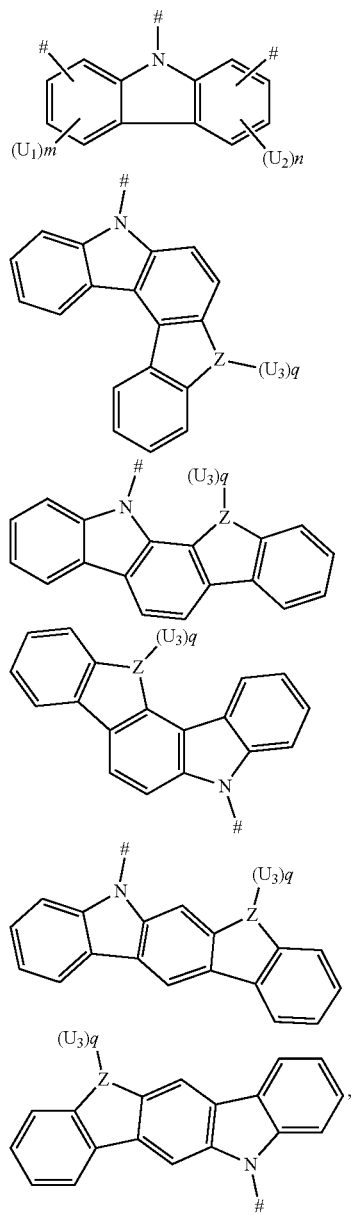

where Z is a C atom, an N atom, an O atom or an S atom;

$U_1$, $U_2$ and $U_3$ are each independently selected from the group consisting of a hydrogen atom, C1-C6 alkyl, and C1-C6 alkoxy;

q is 0, 1 or 2;

when Z is an oxygen atom or a sulfur atom, q is 0;

indicates a bonding position.

According to one embodiment of the boron heterocyclic compound of the present disclosure, D is any one of the following groups:

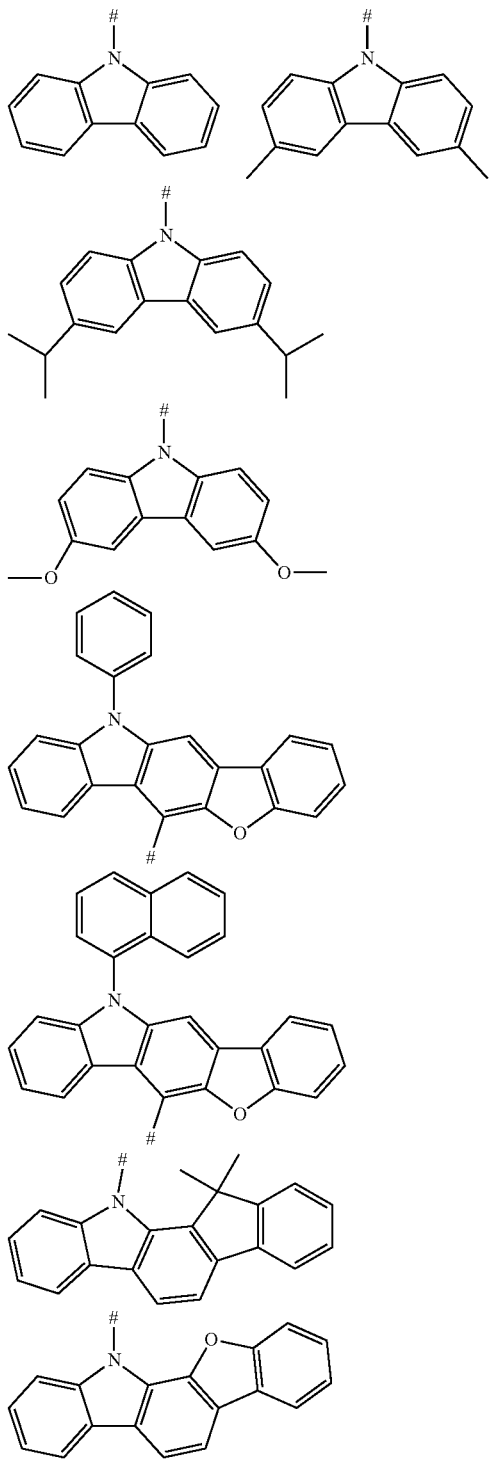

-continued
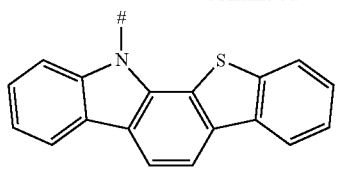
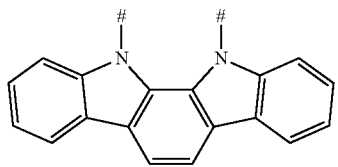
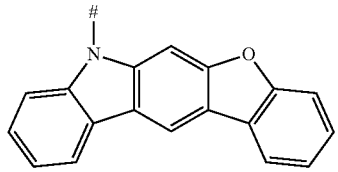
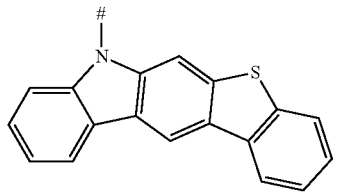
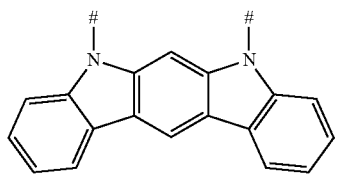
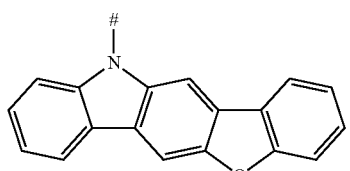
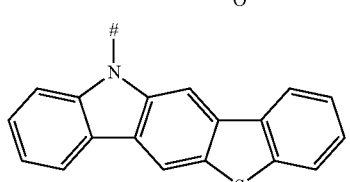
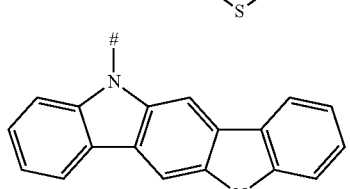
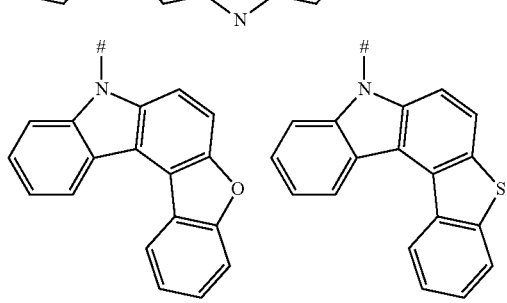
-continued
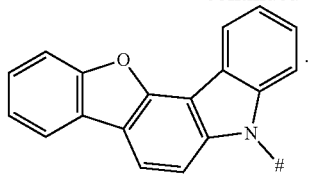
According to one embodiment of the boron heterocyclic compound of the present disclosure, D is any one of the following groups:
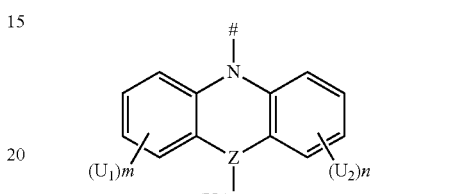
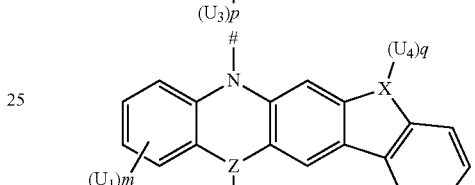
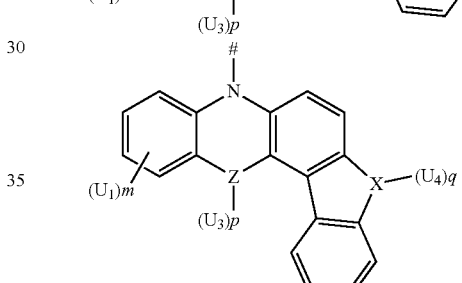
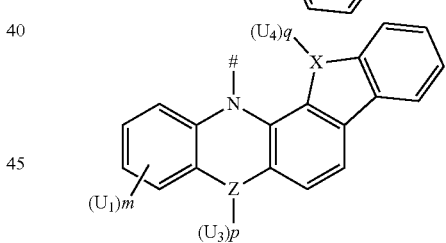
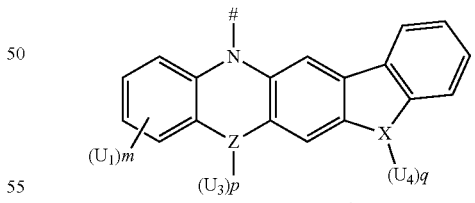
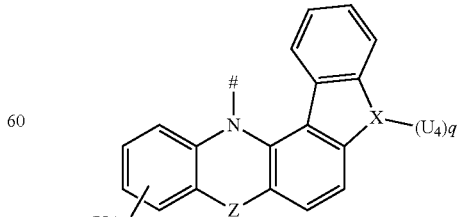

where Z is a C atom, an N atom, an O atom, an S atom, or a Si atom;

X is a C atom, an N atom, an O atom or an S atom;

$U_1$, $U_2$, $U_3$, and $U_4$ are each independently selected from the group consisting of a hydrogen atom, C1-C6 alkyl, C3-C6 cycloalkyl, C1-C6 alkoxy, and C6-C12 aryl;

m, n, p and q are each independently 0, 1 or 2;

when Z or X is an oxygen atom or a sulfur atom, p or q is 0; and indicates a bonding position.

According to one embodiment of the boron heterocyclic compound of the present disclosure, D is any one of the following groups:

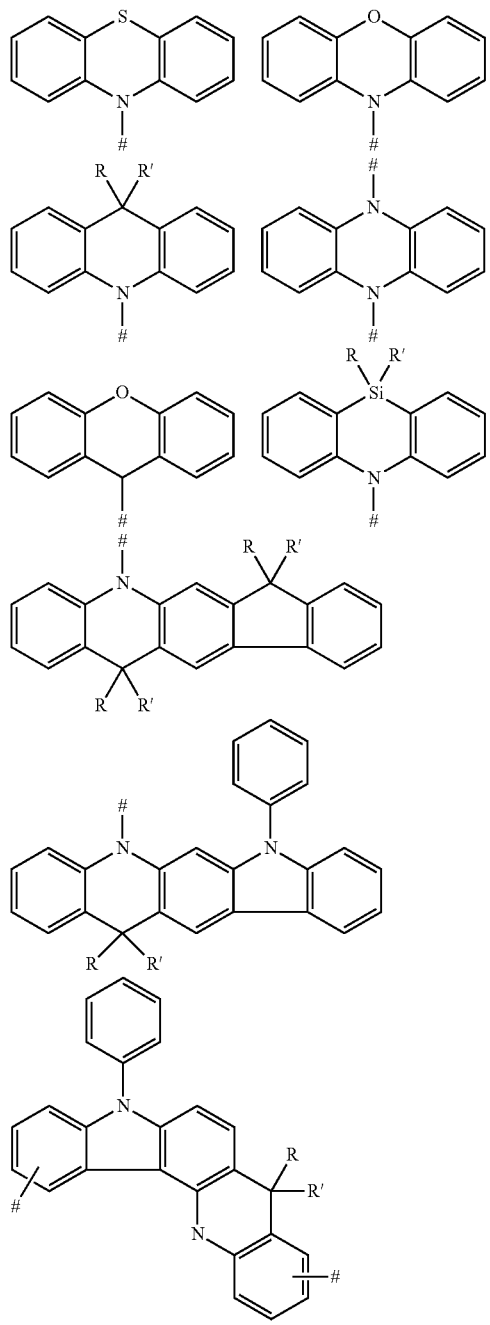

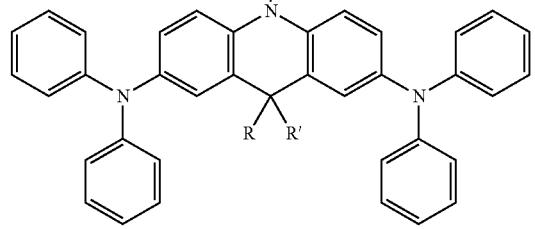

where R and R' are each independently selected from the group consisting of a hydrogen atom, C1-C4 alkyl, and phenyl.

According to one embodiment of the boron heterocyclic compound of the present disclosure, D is any one of the following groups:

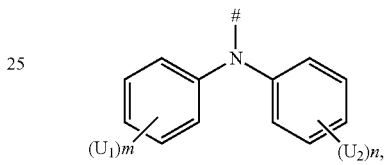

where $U_1$ and $U_2$ are each independently selected from the group consisting of a hydrogen atom, C1-C6 alkyl, and C1-C6 alkoxy;

m and n are integers each independently selected from 0, 1, or 2; and indicates a bonding position.

According to one embodiment of the boron heterocyclic compound of the present disclosure, D is selected from any one or more of the following groups:

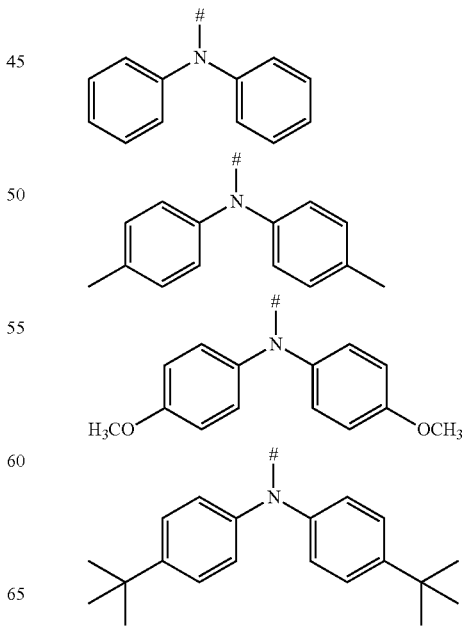

-continued

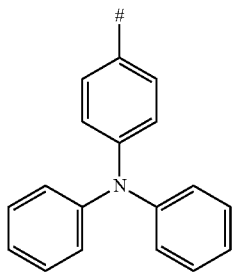

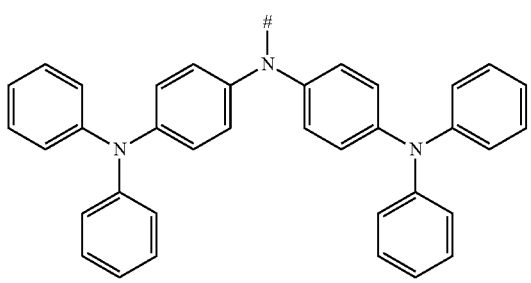

where # indicates a bonding position.

According to one embodiment of the boron heterocyclic compound of the present disclosure, D is any one of the following groups:

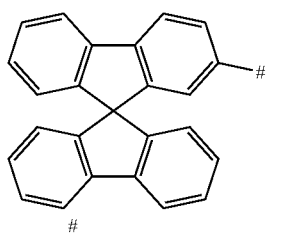

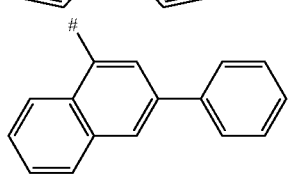

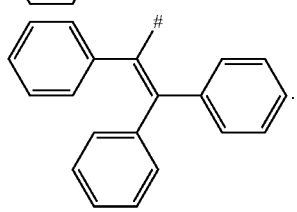

According to one embodiment of the boron heterocyclic compound of the present disclosure, L is any one of the following groups:

D is selected from the following groups:

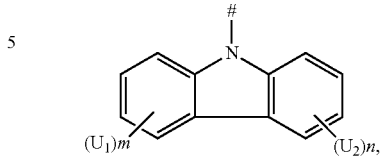

where U1 and U2 are each independently selected from the group consisting of methyl, ethyl, isopropyl, isobutyl, and t-butyl; and m and n are integers each independently selected from 0, 1, or 2.

According to one embodiment of the boron heterocyclic compound of the present disclosure, L is any one of the following groups:

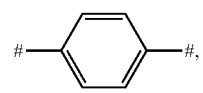

D is selected from the following groups:

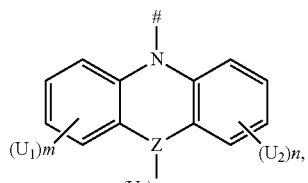

where Z is a C atom, an N atom, an O atom or an S atom;
U1, U2 and U3 are each independently selected from the group consisting of methyl, ethyl, isopropyl, isobutyl, tert-butyl, and C6-C12 aryl;
m and n are 0, and p is 0, 1 or 2;
when Z or X is an oxygen atom or a sulfur atom, p is 0; and
indicates a bonding position.

According to one embodiment of the boron heterocyclic compound of the present disclosure, L is any one of the following groups:

D is selected from the following groups:

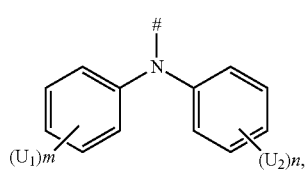

where $U_1$ and $U_2$ are each independently selected from the group consisting of methyl, ethyl, isopropyl, isobutyl, and t-butyl; and m and n are integers each independently selected from 0, 1, or 2.

In the boron heterocyclic compound of the present disclosure, when L is phenyl, HOMO and LUMO can be more easily separated. In addition, in a practical preparation process, it is difficult to directly bond the boron atom of the precursor to a group such as carbazolyl or acridinyl, and thus the synthesis is difficult. When they are bonded through phenyl, the synthesis difficulty of the boron heterocyclic compound according the present disclosure can be reduced. Further, when L is phenyl, the boding at para-positions can effectively adjust the spectrum of the compound and improve the thermal stability.

In the above three examples, $U_1$ and $U_2$ represent a non-linear alkyl having a carbon number of 4 or less, such as methyl, ethyl, isopropyl, isobutyl, tert-butyl, in order to make the molecule of the compound smaller. The carbon chain of alkyl has a limited length, and thus the compound is more suitable for manufacturing OLED devices by vapor deposition instead of inkjet printing. During the vapor deposition process, alkyl having a long carbon chain is likely to be broken, resulting in unstable performance of the OLED device.

According to one embodiment of the boron heterocyclic compound of the present disclosure, a number of benzene ring included in D is smaller than or equal to 8. If the number of benzene ring contained in the electron donor D is too great, the conjugation length of the compound molecule will be too long and the triplet level will be too low, which can result in a red shift in the emission wavelength of the compound. By limiting the number of benzene rings contained in the electron donor to be smaller than and equal to 8, the conjugate length is shortened and the energy level is increased, which not only ensures the luminescence wavelength of the compound in a blue region, but also avoids the red shift of the luminescence wavelength of the compound, thereby improving the stability of the compound molecule.

According to one embodiment of the boron heterocyclic compound of the present disclosure, the boron heterocyclic compound is selected from the following compounds:

M1

M2

-continued

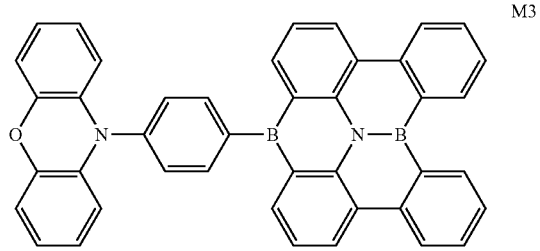

M3

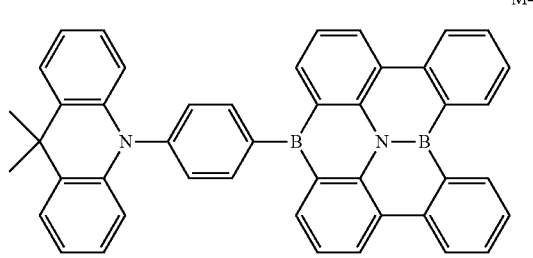

M4

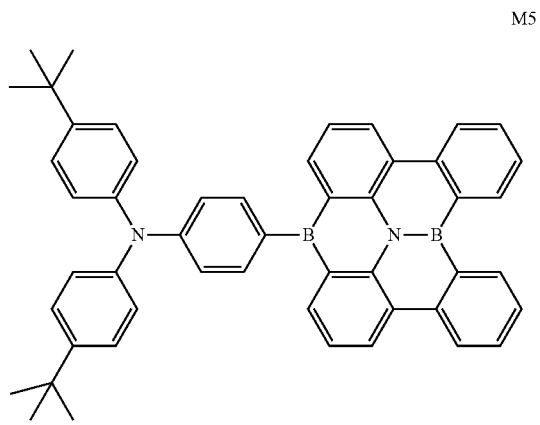

M5

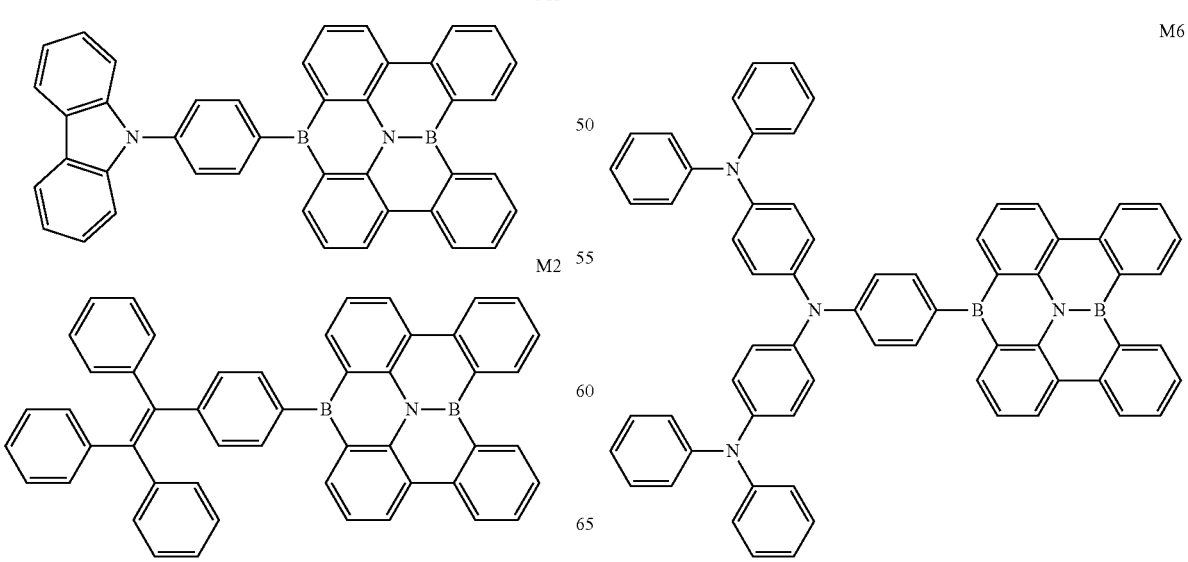

M6

-continued
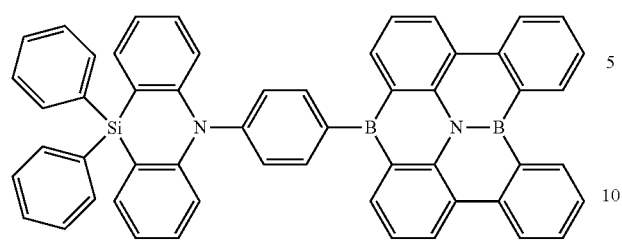
M7
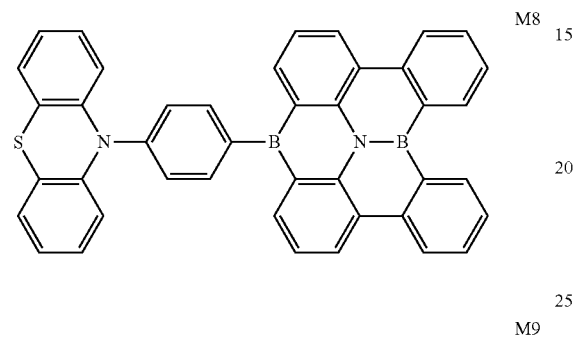
M8
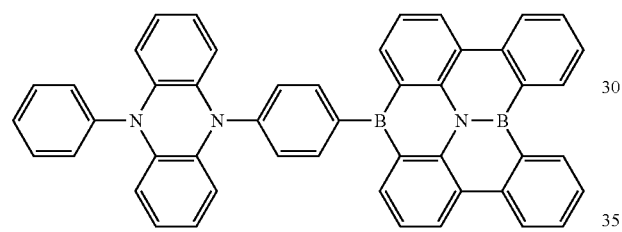
M9
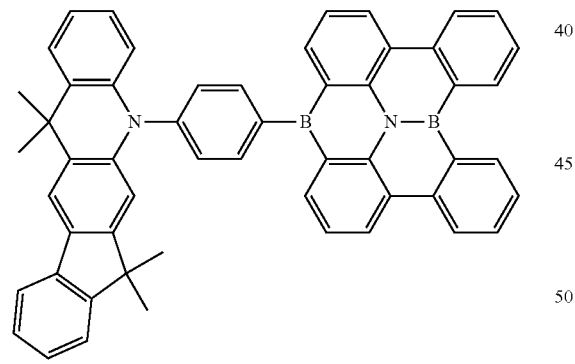
M10
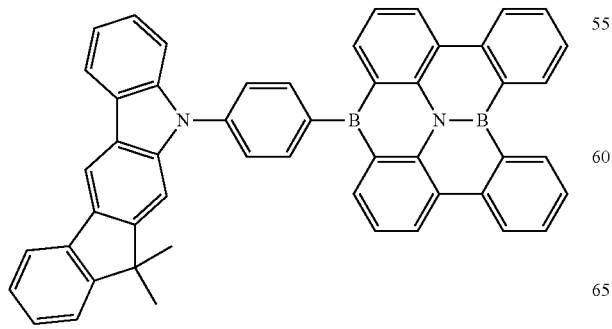
M11
-continued
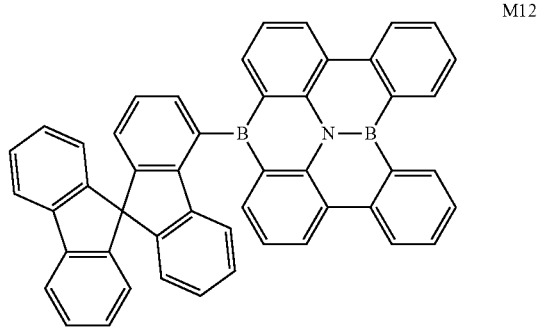
M12
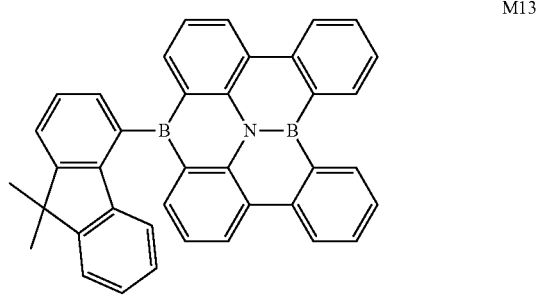
M13
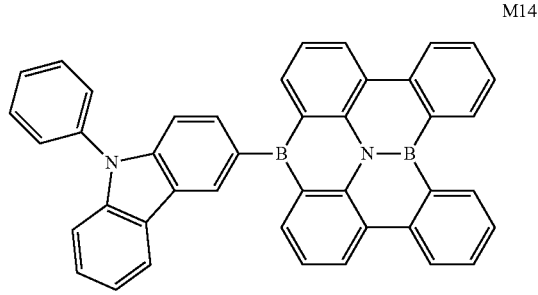
M14
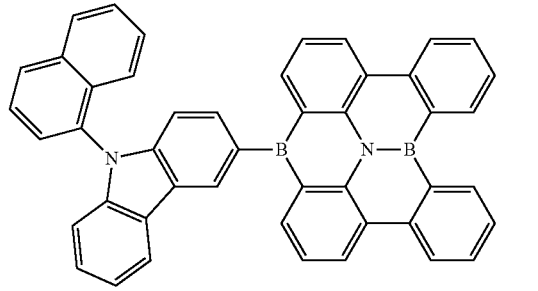
M15
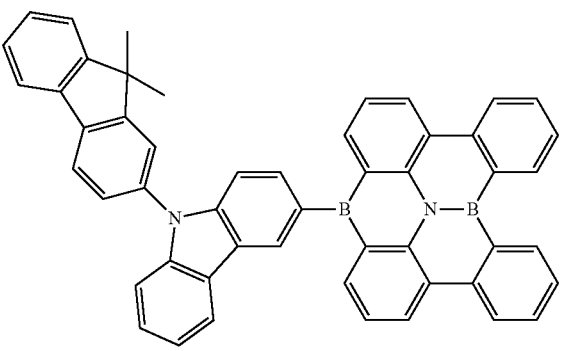
M16

M17 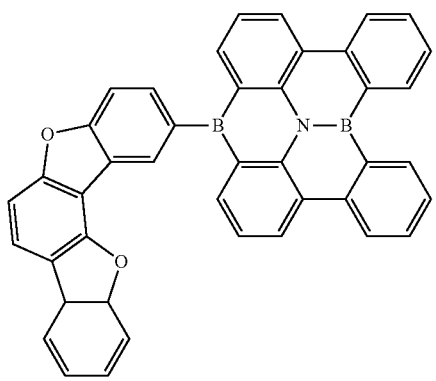

M21 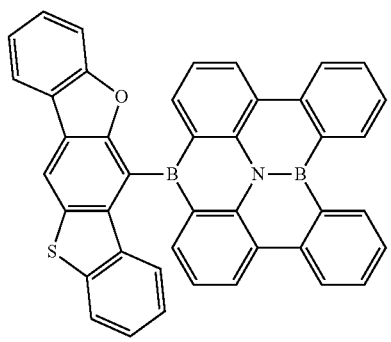

M18 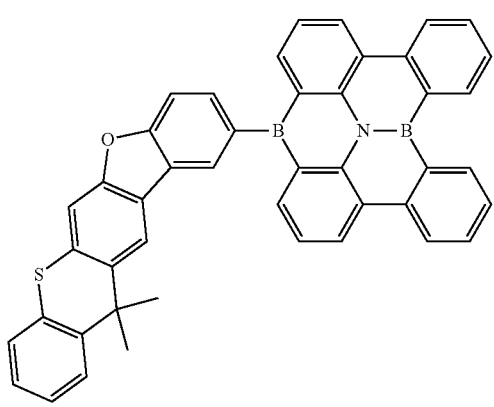

M22 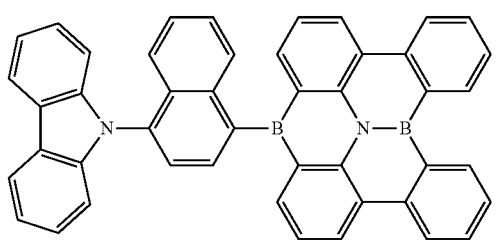

M23 

M19 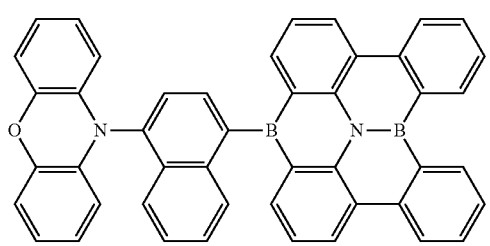

M24 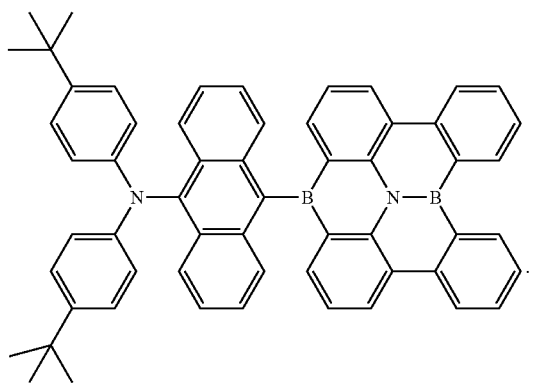

M20 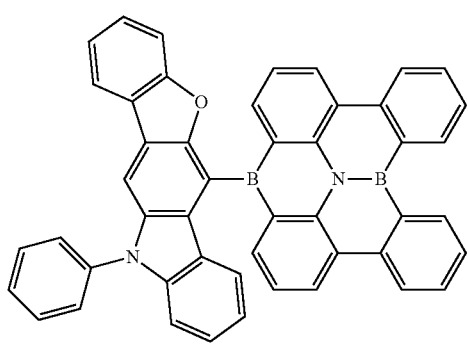

In the boron heterocyclic compound of the present disclosure, phenyl can facilitates the separation between the HOMO and the LUMO of the compound molecule, when compared with the heterocyclic aromatic compound or the compound molecule without phenyl. In addition, during the practical preparation, it is difficult to directly bond the boron atom of the precursor to a group such as carbazolyl or acridinyl, and thus the synthesis is difficult. In the boron heterocyclic compound of the present disclosure, boron atoms are bonded to a benzene ring of the group represented by D, including phenylene bonded to a benzene ring (for example, M1, M2, M10, M11, etc.), and other ring-fused forms (for example, M12, M13, M14, etc.). The raw materials are readily available, and the synthesis of the compounds is also easier.

In the boron heterocyclic compound of the present disclosure, an energy difference $\Delta E_{st}$ between a lowest singlet energy level S1 and a lowest triplet energy level T1 satisfies: $\Delta E_{st}=E_{S1}-E_{T1}\leq 0.20$ eV.

The boron heterocyclic compound of the present disclosure has TADF property and can be used as a guest material of an OLED light-emitting layer.

Another embodiment of the present disclosure provides a process for preparing several exemplary boron heterocyclic compounds, such as those described in Examples 1 and 2 below.

The boron heterocyclic compounds M1 and M2 can be synthesized according to the following synthetic schemes. The synthetic schemes of the boron heterocyclic compounds M3 and M4 are substantially same as those of compounds M1 and M2, except the differences in the respective substrates selected in the final step.

EXAMPLE 1

Synthesis of Boron Heterocyclic Compounds M1 and M2

The synthetic schemes of the boron heterocyclic compounds M1 and M2 are shown below.

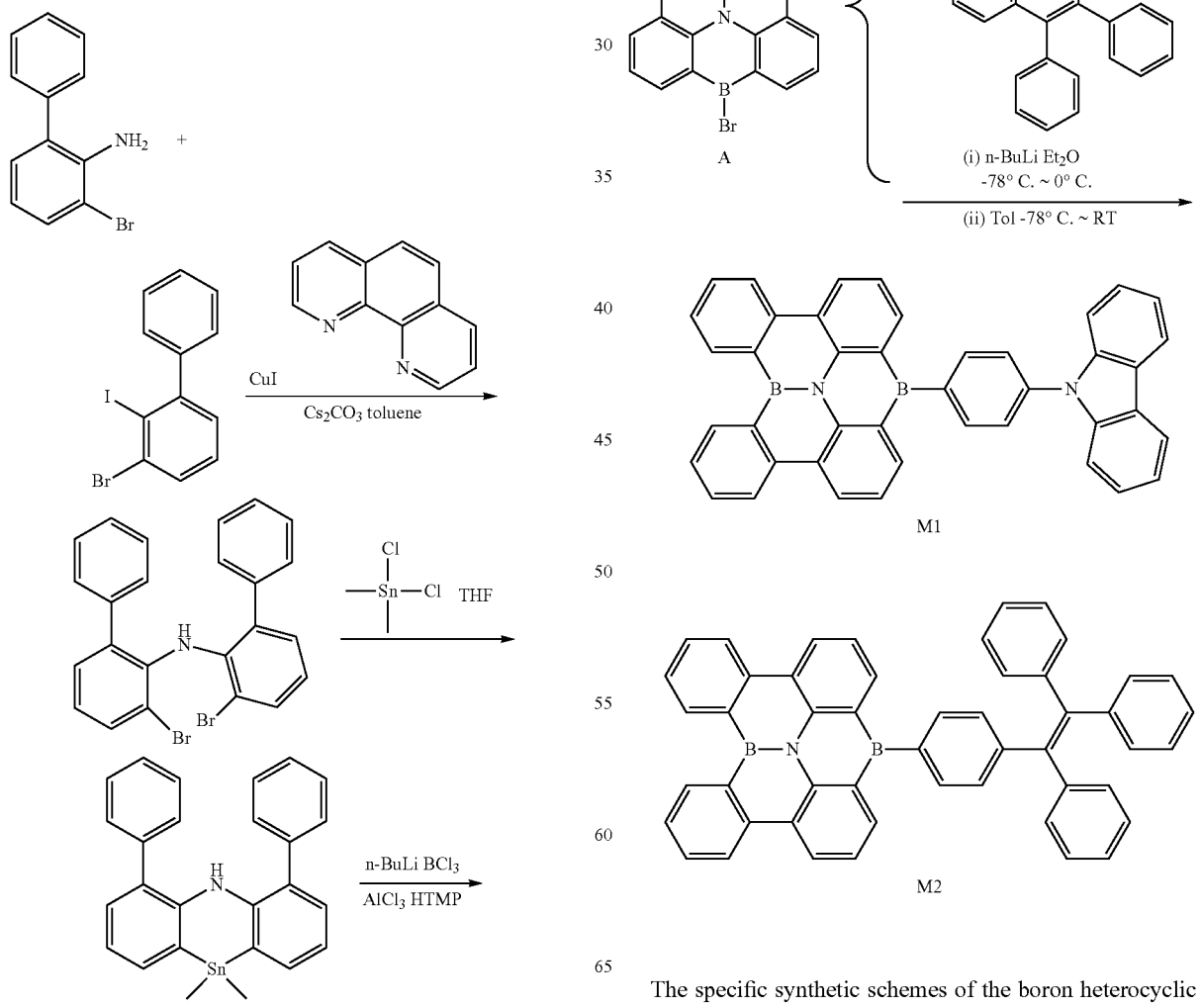

The specific synthetic schemes of the boron heterocyclic compounds M1 and M2 are as follows.

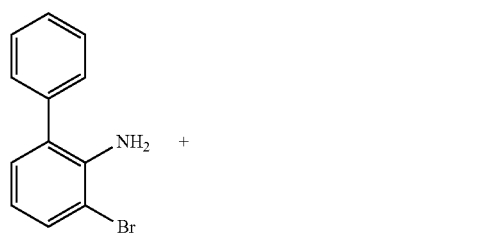

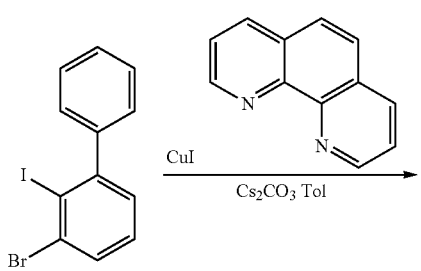

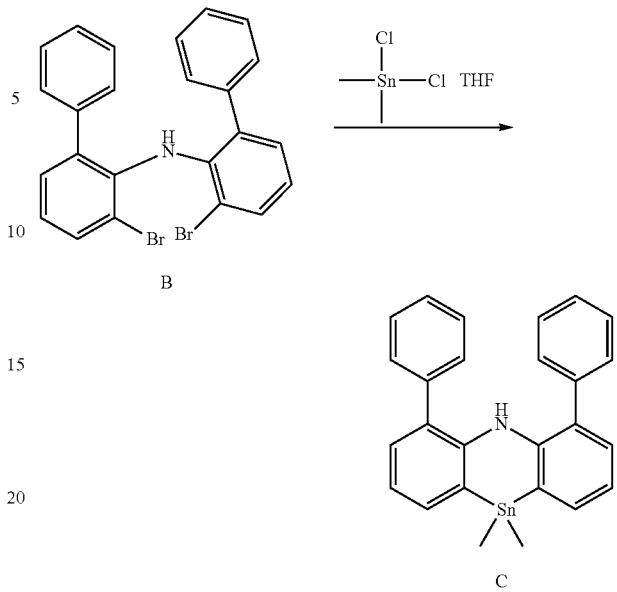

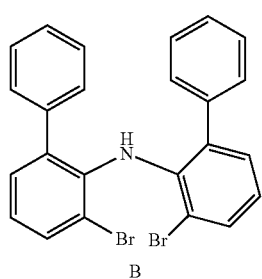

20 g (80.61 mmol) of 2-amino-3-bromobiphenyl, 28.94 g (80.61 mmol) of 2-iodo-3-bromobiphenyl, 52.52 g (161.21 mmol) of cesium carbonate were sequentially added to a three-necked flask. 200 mL toluene solution was added and stirred thoroughly. After performing nitrogen displacement three times, 1.54 g (8.06 mmol) of copper iodide and 2.91 g (16.12 mmol) of 1,10-phenanthroline were added under a nitrogen atmosphere. After the addition, the nitrogen displacement was performed three times, then the mixture was stirred at 80° C. for 12 h and then cooled to room temperature, the reaction was quenched with 200 mL of saturated NaHSO$_3$. Then, the organic phase was firstly extracted with dichloromethane (150 mL), then extracted with the saturated NaHSO$_3$ two times, and finally extracted with saturated saline one time. The organic phase was collected and then added with anhydrous magnesium sulfate while stirring. The dried organic phase was then filtered and distillated by using a rotary evaporator to remove solvent. The obtained product was purified through silica gel column chromatography (mobile phase: hexane:methylenechloride=20:1), so as to obtain 18.2 g (73.35 mmol) of white solid, and yield was 47.1%.

HRMS (ESI): m/z: 481;

$^1$H NMR (400 MHz, CCl$_3$-d$_6$) δ 8.04 (s, 2H), 7.76 (s, 2H), 7.42 (d, J=8.0 Hz, 6H), 7.07 (d, J=8.0 Hz, 6H), 3.63 (s, 1H).

$^{13}$C NMR (100 MHz, CCl$_3$-d$_6$) δ 139.93 (s), 139.06 (s), 133.38 (s), 132.06 (s), 128.77 (s), 128.40 (s), 128.08 (s), 127.26 (s), 123.39 (s), 114.72 (s).

18.2 g (37.59 mmol) of compound B was added into the reaction flask, dissolved with the added THF (200 mL). After performing nitrogen displacement three times, 12.38 g (56.34 mmol) of dimethyltin chloride was slowly added, and the mixture was refluxed for 12 h. The reaction was quenched with ice water (100 mL). The mixture was extracted with DCM (80 mL×2), and then extracted once with saturated brine. The organic phase was collected and evaporated to obtain a pale yellow oil. Crystallization was performed by using toluene/ethanol to obtain 9.1 g (19.43 mmol) of pale yellow solid, and yield was 51.7%.

MALDI-TOF: m/z: 469;

$^{13}$C NMR (100 MHz, CCl$_3$-d$_6$) δ 139.06 (s), 134.76 (s), 133.69 (s), 131.09 (s), 128.77 (s), 128.40 (s), 128.08 (d, J=1.1 Hz), 114.16 (s), 102.38 (s), −7.11 (s).

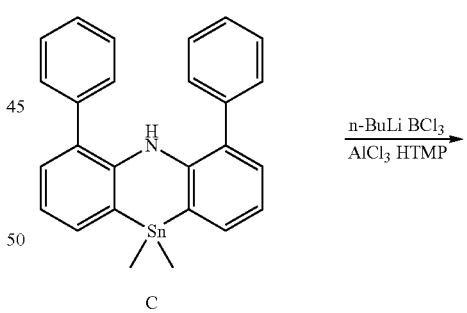

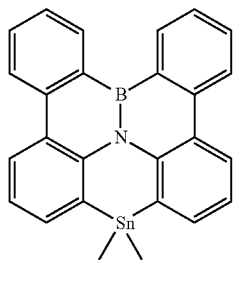

9.1 g (19.4 mmol) of Compound C and 200 mL of toluene solution were added into a three-necked flask (500 mL), and then cooled to −78° C. after performing nitrogen displacement three times. 7.76 mL (19.4 mmol) of n-BuLi was added dropwise, then the temperature was increased to 0° C. after finishing the dropwise addition, and the mixture was stirred for 2 h. After being cooled to −78° C. again, BCl₃ (3.40 g, 19.4 mmol) was added, and then the mixture was slowly warmed to room temperature and reacted for 8 h. Then the toluene solution was removed through rotary evaporation, and the evaporated mixture was added into a reaction flask including 10.32 g (77.61 mmol) of aluminum trichloride and 4.10 g (29.1 mmol) of HTMP. The mixture was heated to 150° C., and stirred overnight. H₂O (200 mL) was slowly added to quench the reaction. The reaction solution was extracted with DCM (100 mL×3), and then extracted once with saturated brine. The organic phase was collected, dried with anhydrous magnesium sulfate. The dried organic phase was filtered and the solvent in the filtrate was removed through rotary evaporation. Crystallization was performed by using DCM/EtOH to obtain 6.5 g (13.6 mmol) of pale yellow solid, and yield was 69%.

MALDI-TOF: m/z: 408.6;

¹H NMR (400 MHz, CCl₃-d₆) δ 8.10 (s, 1H), 7.94 (s, 1H), 7.77 (s, 1H), 7.52 (d, J=16.0 Hz, 2H), 7.42 (s, 1H), 7.17 (s, 1H), 0.48 (s, 3H).

¹³C NMR (100 MHz, CCl₃-d₆) δ 142.74 (s), 141.62 (s), 137.00 (s), 131.25 (s), 131.04 (s), 129.54 (s), 129.01 (s), 127.06 (s), 125.16 (s), 120.75 (s), 117.80 (s), 108.87 (s), −7.11 (s).

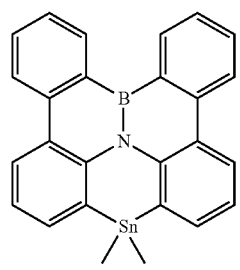

D

BBr₃ 100° C.

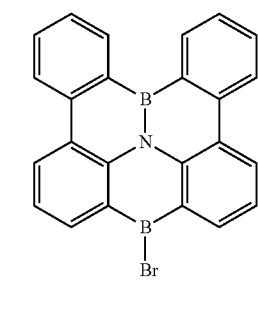

E 6.5 g (13.65 mmol) of Compound D, 5.08 g (20.48 mmol) of BCl₃, and toluene (100 ml) were sequentially added into a three-necked flask (250 ml), and was stirred. After performing nitrogen displacement three times, and the mixture was refluxed at 100° C. for 24 h, while monitoring the reaction end point through HPLC. Cl₂ was introduced and the reaction was continued for 5 h. The temperature was lowered to room temperature, the mixture was dried, and the organic phase was distilled under reduced pressure to obtain Compound D. Crystallization was performed by using DCM/EtOH to obtain 5.2 g (12.4 mmol) of pale yellow solid, and yield was 90%.

MALDI-TOF: m/z: 419.6;

¹H NMR (400 MHz, CCl₃-d₆) δ 8.13 (s, 1H), 7.91 (dd, J=92.0, 40.0 Hz, 79H), 7.50 (s, 13H), 7.42 (s, 10H), 7.17 (s, 10H).

¹³C NMR (100 MHz, CCl₃-d₆) δ 147.13 (s), 144.01 (s), 141.62 (s), 132.32 (s), 131.25 (s), 131.04 (s), 129.54 (s), 127.06 (s), 125.16 (s), 122.11 (s), 118.91 (s), 108.40 (s).

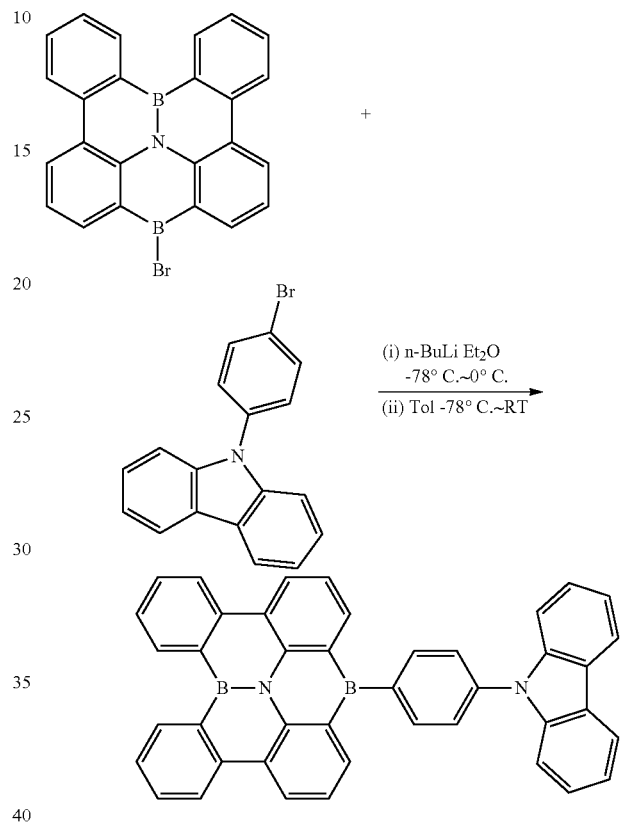

2.77 g (8.62 mmol) of 4-bromophenylcarbazole was added in the reaction flask, and dissolved by adding diethyl ether (50 mL), following by performing nitrogen displacement three times. The temperature was lowered to −78° C., and 3.44 mL (2.5 M, 8.62 mmol) of n-BuLi was added dropwise while the temperature was controlled at −65° C. or lower, and then the mixture was stirred for 30 min. Further, 3 g (7.19 mmol) of monomer A was dissolved in 60 mL of toluene, and then added dropwise to the reaction liquid. The mixture was naturally warmed up to room temperature and reacted for 6 h. The reaction was quenched with ice water (100 mL), the mixture was extracted with DCM (80 mL×2) and then extracted once with saturated brine. The organic phase was collected and the solvent was removed through rotary evaporation to obtain a yellow oil. The product was purified by column chromatography (mobile phase: hexane: methylenechloride=3:1) to obtain 2.83 g (4.87 mmol) of yellow green solid, and yield was 67.8%.

MALDI-TOF: m/z: 581;

¹H NMR (400 MHz, CCl₃-d₆) δ 8.55 (s, 2H), 8.14 (d, J=36.0 Hz, 6H), 7.94 (s, 3H), 7.93 (s, 1H), 7.80 (dd, J=40.0, 24.0 Hz, 17H), 7.51 (d, J=8.0 Hz, 6H), 7.41 (d, J=8.0 Hz, 6H), 7.24-7.08 (m, 12H).

¹³C NMR (100 MHz, CCl₃-d₆) δ 149.09 (s), 147.95 (s), 147.13 (s), 141.62 (s), 135.38 (s), 134.82 (s), 131.25 (s), 131.04 (s), 130.24 (s), 129.54 (s), 128.67 (s), 127.72 (s), 127.06 (s), 125.67 (s), 125.16 (s), 122.36 (s), 121.91 (s), 121.15 (d, J=2.7 Hz), 118.87 (s), 114.95 (s), 110.58 (s).

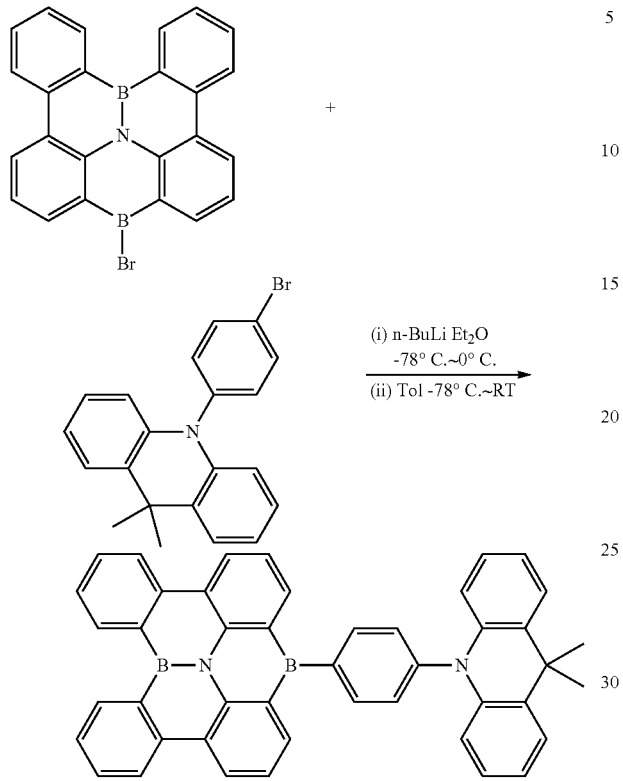

3.53 g (8.63 mmol) of 4-bromophenyl-3-phenylethylene was added into a reaction flask, and dissolved by adding diethyl ether (30 mL), following by performing nitrogen displacement three times. The temperature was lowered to −78° C., and 3.45 mL (2.5 M, 8.63 mmol) of n-BuLi was added dropwise while the temperature was controlled at −65° C. or lower, and then the mixture was stirred for 30 min. Further, 3 g (7.19 mmol) of monomer A was dissolved in 30 mL of toluene, and then added dropwise to the reaction liquid. The mixture was naturally warmed up to room temperature and reacted for 6 h. The reaction was quenched with ice water (500 mL), the mixture was extracted with DCM (40 mL×2) and then extracted once with saturated brine. The organic phase was collected and the solvent was removed through rotary evaporation to obtain a pale yellow oil. The hot melt crystallization was performed by adding 15 mL of toluene to obtain 2.08 g (3.10 mmol) white solid, and yield was 61.1%.

MALDI-TOF: m/z: 671;

$^1$H NMR (400 MHz, CCl$_3$-d$_6$) δ 8.02 (d, J=64.0 Hz, 3H), 7.78 (t, J=12.0 Hz, 5H), 7.50 (s, 1H), 7.40 (d, J=16.0 Hz, 8H), 7.32 (s, 4H), 7.19 (d, J=20.0 Hz, 3H).

$^{13}$C NMR (100 MHz, CCl$_3$-d$_6$) δ 149.53 (s), 147.95 (s), 147.13 (s), 141.96-141.51 (m), 136.08 (s), 132.06 (s), 131.25 (s), 131.04 (s), 130.24 (s), 129.51 (d, J=5.6 Hz), 128.58 (d, J=16.2 Hz), 127.44 (s), 127.06 (s), 125.16 (s), 122.36 (s), 118.87 (s), 110.58 (s).

EXAMPLE 2

Synthesis of Boron Heterocyclic Compounds M3 and M4

The synthetic schemes of the boron heterocyclic compounds M3 and M4 are shown as below.

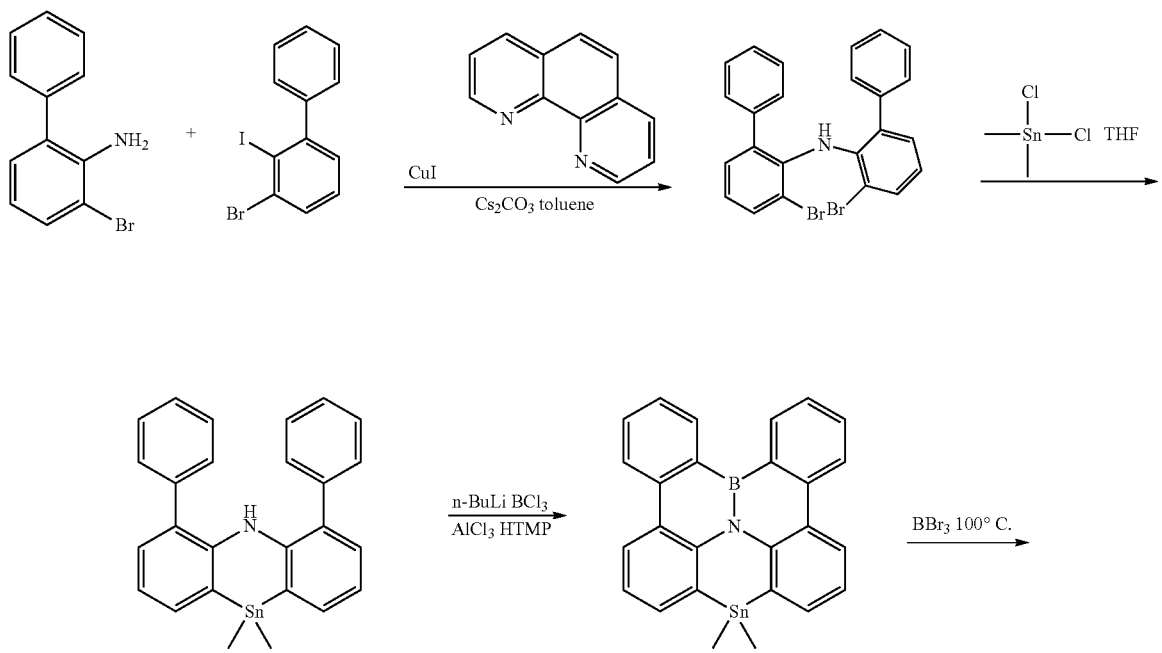

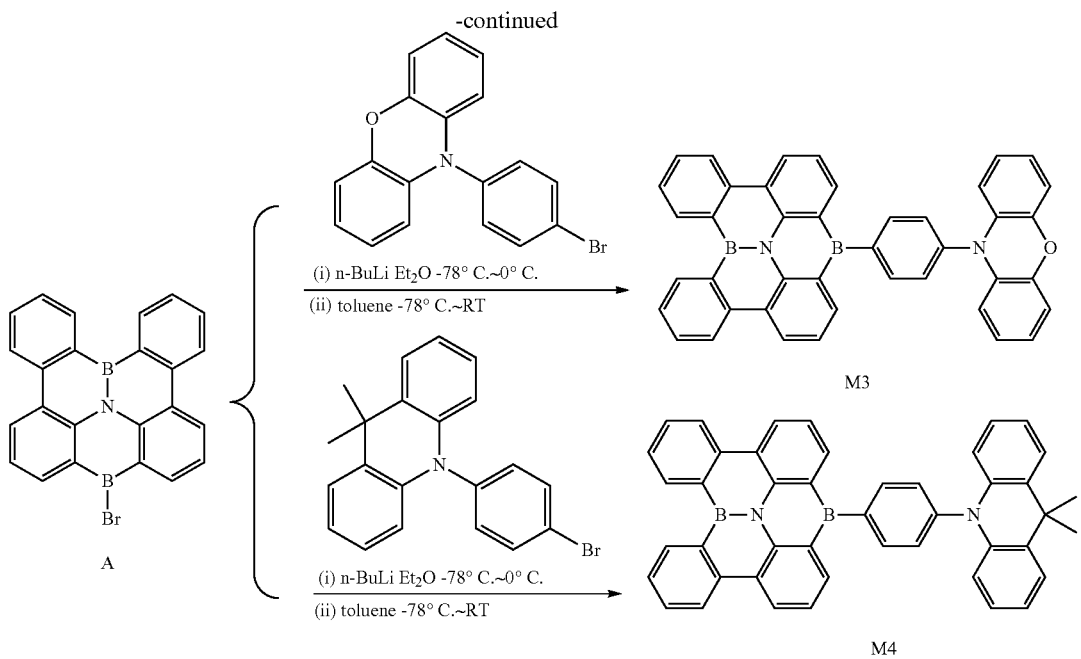

The specific synthetic schemes of the boron heterocyclic compounds M3 and M4 are as follows.

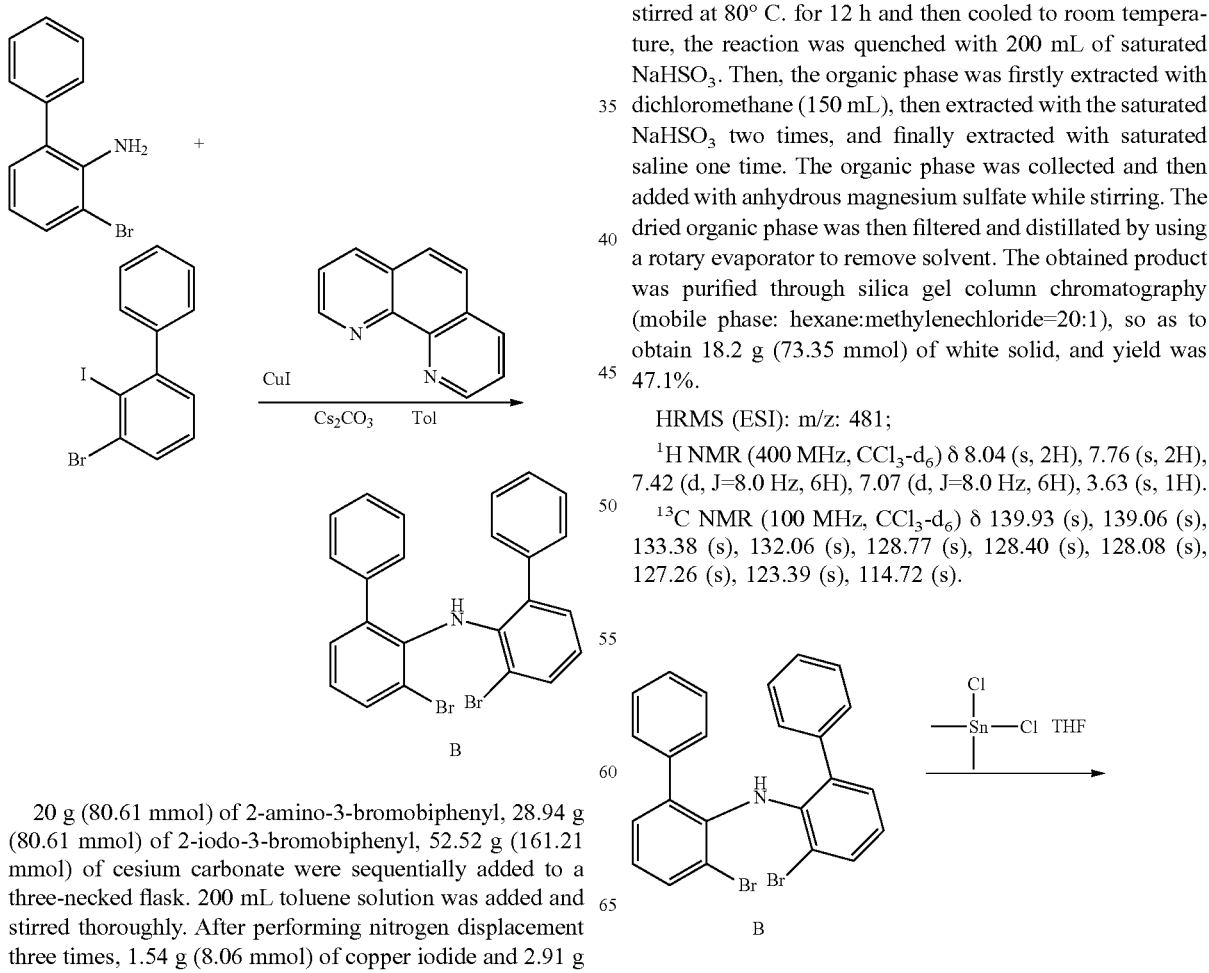

20 g (80.61 mmol) of 2-amino-3-bromobiphenyl, 28.94 g (80.61 mmol) of 2-iodo-3-bromobiphenyl, 52.52 g (161.21 mmol) of cesium carbonate were sequentially added to a three-necked flask. 200 mL toluene solution was added and stirred thoroughly. After performing nitrogen displacement three times, 1.54 g (8.06 mmol) of copper iodide and 2.91 g (16.12 mmol) of 1,10-phenanthroline were added under a nitrogen atmosphere. After the addition, the nitrogen displacement was performed three times, then the mixture was stirred at 80° C. for 12 h and then cooled to room temperature, the reaction was quenched with 200 mL of saturated NaHSO$_3$. Then, the organic phase was firstly extracted with dichloromethane (150 mL), then extracted with the saturated NaHSO$_3$ two times, and finally extracted with saturated saline one time. The organic phase was collected and then added with anhydrous magnesium sulfate while stirring. The dried organic phase was then filtered and distillated by using a rotary evaporator to remove solvent. The obtained product was purified through silica gel column chromatography (mobile phase: hexane:methylenechloride=20:1), so as to obtain 18.2 g (73.35 mmol) of white solid, and yield was 47.1%.

HRMS (ESI): m/z: 481;

$^1$H NMR (400 MHz, CCl$_3$-d$_6$) δ 8.04 (s, 2H), 7.76 (s, 2H), 7.42 (d, J=8.0 Hz, 6H), 7.07 (d, J=8.0 Hz, 6H), 3.63 (s, 1H).

$^{13}$C NMR (100 MHz, CCl$_3$-d$_6$) δ 139.93 (s), 139.06 (s), 133.38 (s), 132.06 (s), 128.77 (s), 128.40 (s), 128.08 (s), 127.26 (s), 123.39 (s), 114.72 (s).

-continued

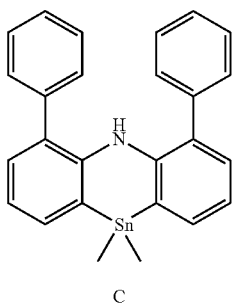

C 18.2 g (37.59 mmol) of compound B was added into the reaction flask, dissolved with the added THF (200 mL). After performing nitrogen displacement three times, 12.38 g (56.34 mmol) of dimethyltin chloride was slowly added, and the mixture was refluxed for 12 h. The reaction was quenched with ice water (100 mL). The mixture was extracted with DCM (80 mL×2), and then extracted once with saturated brine. The organic phase was collected and evaporated to obtain a pale yellow oil. Crystallization was performed by using toluene/ethanol to obtain 9.1 g (19.43 mmol) of pale yellow solid, and yield was 51.7%.

MALDI-TOF: m/z: 469;

$^{13}$C NMR (100 MHz, CCl$_3$-d$_6$) δ 139.06 (s), 134.76 (s), 133.69 (s), 131.09 (s), 128.77 (s), 128.40 (s), 128.08 (d, J=1.1 Hz), 114.16 (s), 102.38 (s), −7.11 (s).

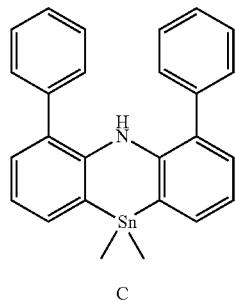

C n-BuLi BCl$_3$
────────→
AlCl$_3$ HTMP

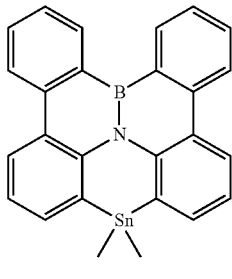

D 9.1 g (19.4 mmol) of Compound C and 200 mL of toluene solution were added into a three-necked flask (500 mL), and then cooled to −78° C. after performing nitrogen displacement three times. 7.76 mL (19.4 mmol) of n-BuLi was added dropwise, then the temperature was increased to 0° C. after finishing the dropwise addition, and the mixture was stirred for 2 h. After being cooled to −78° C. again, BCl$_3$ (3.40 g, 19.4 mmol) was added, and then the mixture was slowly warmed to room temperature and reacted for 8 h. Then the toluene solution was removed through rotary evaporation, and the evaporated mixture was added into a reaction flask including 10.32 g (77.61 mmol) of aluminum trichloride and 4.10 g (29.1 mmol) of HTMP. The mixture was heated to 150° C., and stirred overnight. H$_2$O (200 mL) was slowly added to quench the reaction. The reaction solution was extracted with DCM (100 mL×3), and then extracted once with saturated brine. The organic phase was collected, dried with anhydrous magnesium sulfate. The dried organic phase was filtered and the solvent in the filtrate was removed through rotary evaporation. Crystallization was performed by using DCM/EtOH to obtain 6.5 g (13.6 mmol) of pale yellow solid, and yield was 69%.

MALDI-TOF: m/z: 408.6;

$^1$H NMR (400 MHz, CCl$_3$-d$_6$) δ 8.10 (s, 1H), 7.94 (s, 1H), 7.77 (s, 1H), 7.52 (d, J=16.0 Hz, 2H), 7.42 (s, 1H), 7.17 (s, 1H), 0.48 (s, 3H).

$^{13}$C NMR (100 MHz, CCl$_3$-d$_6$) δ 142.74 (s), 141.62 (s), 137.00 (s), 131.25 (s), 131.04 (s), 129.54 (s), 129.01 (s), 127.06 (s), 125.16 (s), 120.75 (s), 117.80 (s), 108.87 (s), −7.11 (s).

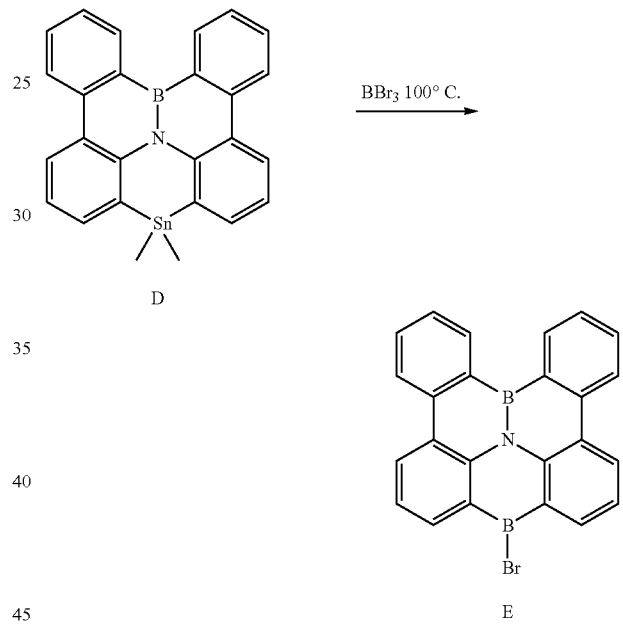

6.5 g (13.65 mmol) of Compound D, 5.08 g (20.48 mmol) of BCl$_3$, and toluene (100 ml) were sequentially added into a three-necked flask (250 ml), and was stirred. After performing nitrogen displacement three times, and the mixture was refluxed at 100° C. for 24 h, while monitoring the reaction end point through HPLC. Cl$_2$ was introduced and the reaction was continued for 5 h. The temperature was lowered to room temperature, the mixture was dried, and the organic phase was distilled under reduced pressure to obtain Compound D. Crystallization was performed by using DCM/EtOH to obtain 5.2 g (12.4 mmol) of pale yellow solid, and yield was 90%.

MALDI-TOF: m/z: 419.6;

$^1$H NMR (400 MHz, CCl$_3$-d$_6$) δ 8.13 (s, 1H), 7.91 (dd, J=92.0, 40.0 Hz, 79H), 7.50 (s, 13H), 7.42 (s, 10H), 7.17 (s, 10H).

$^{13}$C NMR (100 MHz, CCl$_3$-d$_6$) δ 147.13 (s), 144.01 (s), 141.62 (s), 132.32 (s), 131.25 (s), 131.04 (s), 129.54 (s), 127.06 (s), 125.16 (s), 122.11 (s), 118.91 (s), 108.40 (s).

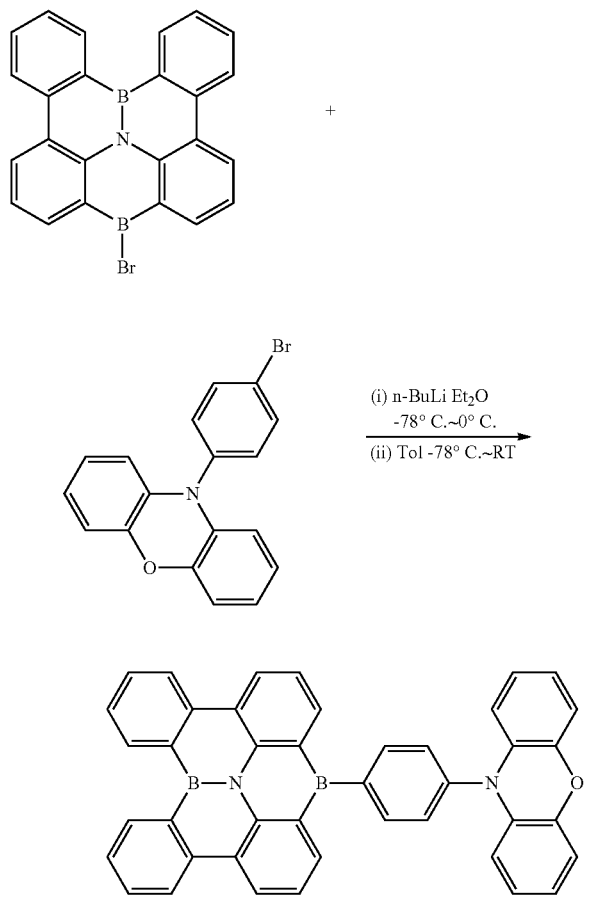

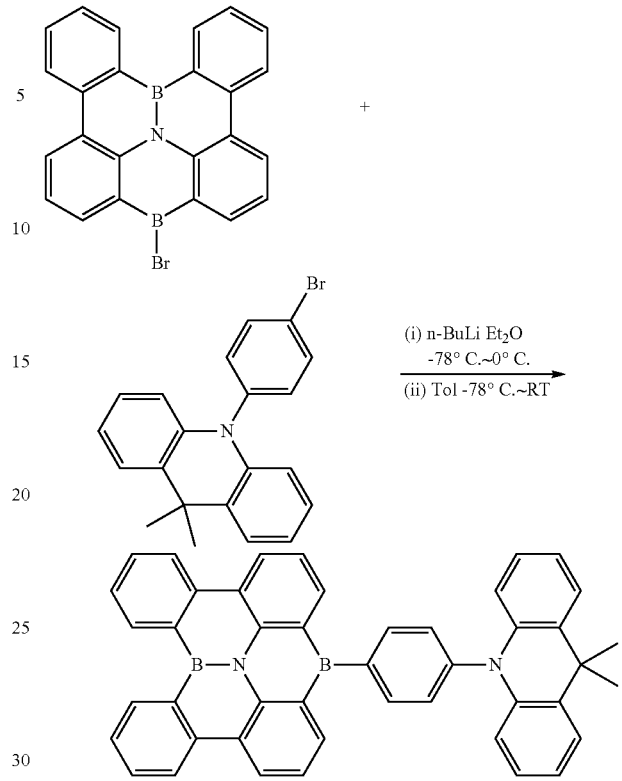

2.92 g (8.62 mmol) of 4-bromophenylphenoxazine was added to the reaction flask, and dissolved by adding diethyl ether (50 mL), following by performing nitrogen displacement three times. The temperature was lowered to −78° C., and 3.44 mL (2.5 M, 8.62 mmol) of n-BuLi was added dropwise while the temperature was controlled at −65° C. or lower, and then the mixture was stirred for 30 min. Further, 3 g (7.19 mmol) of monomer A was dissolved in 60 mL of toluene, and then added dropwise to the reaction liquid. The mixture was naturally warmed up to room temperature and reacted for 6 h. The reaction was quenched with ice water (100 mL), the mixture was extracted with DCM (80 mL×2) and then extracted once with saturated brine. The organic phase was collected and the solvent was removed through rotary evaporation to obtain a yellow oil. The product was purified by column chromatography (mobile phase: hexane:methylenechloride=3:1) to obtain 2.83 g (4.87 mmol) of yellow green solid, and yield was 67.8%.

MALDI-TOF: m/z: 596;

$^1$H NMR (400 MHz, CCl$_3$-d$_6$) δ 8.10 (s, 2H), 7.94 (s, 2H), 7.79 (d, J=16.0 Hz, 2H), 7.74 (d, J=24.0 Hz, 2H), 7.50 (s, 2H), 7.42 (s, 4H), 7.24-7.08 (m, 6H), 7.08-6.85 (m, 6H).

$^{13}$C NMR (100 MHz, CCl$_3$-d$_6$) δ 152.78 (s), 149.92 (s), 147.13 (s), 146.79 (s), 141.62 (s), 134.24 (s), 132.27 (s), 131.25 (s), 131.04 (s), 130.24 (s), 129.54 (s), 128.67 (s), 127.09 (d, J=4.9 Hz), 125.16 (s), 123.59 (d, J=16.4 Hz), 122.36 (s), 118.93 (d, J=13.1 Hz), 116.41 (s), 110.58 (s).

4.14 g (8.63 mmol) of 4-bromophenylacridine was added into the reaction flask, and dissolved by adding diethyl ether (30 mL), following by performing nitrogen displacement three times. The temperature was lowered to −78° C., and 3.45 mL (2.5 M, 8.63 mmol) of n-BuLi was added dropwise while the temperature was controlled at −65° C. or lower, and then the mixture was stirred for 30 min. Further, 3 g (7.19 mmol) of monomer A was dissolved in 30 mL of toluene, and then added dropwise to the reaction liquid. The mixture was naturally warmed up to room temperature and reacted for 6 h. The reaction was quenched with ice water (500 mL), the mixture was extracted with DCM (40 mL×2) and then extracted once with saturated brine. The organic phase was collected and the solvent was removed through rotary evaporation to obtain a pale yellow oil. The hot melt crystallization was performed by adding 15 mL of toluene to obtain 2.08 g (3.10 mmol) white solid, and yield was 61.1%.

MALDI-TOF: m/z: 622;

$^1$H NMR (400 MHz, deuterochloroform) δ 8.10 (s, 2H), 7.94 (s, 2H), 7.79 (d, J=16.0 Hz, 2H), 7.74 (d, J=24.0 Hz, 2H), 7.50 (s, 2H), 7.42 (s, 4H), 7.24-7.08 (m, 6H), 7.08-6.85 (m, 6H). 1.69 (s, 6H).

$^{13}$C NMR (100 MHz, CCl$_3$-d$_6$) δ 152.78 (s), 149.92 (s), 147.13 (s), 142.44 (s), 141.62 (s), 134.24 (s), 133.37 (s), 131.25 (s), 131.04 (s), 130.24 (s), 129.54 (s), 128.95 (s), 128.67 (s), 127.09 (d, J=4.9 Hz), 126.75 (s), 125.16 (s), 122.86 (s), 122.36 (s), 120.00 (s), 118.87 (s), 110.58 (s), 35.71 (s), 29.68 (s).

EXAMPLE 3

Figure 2:
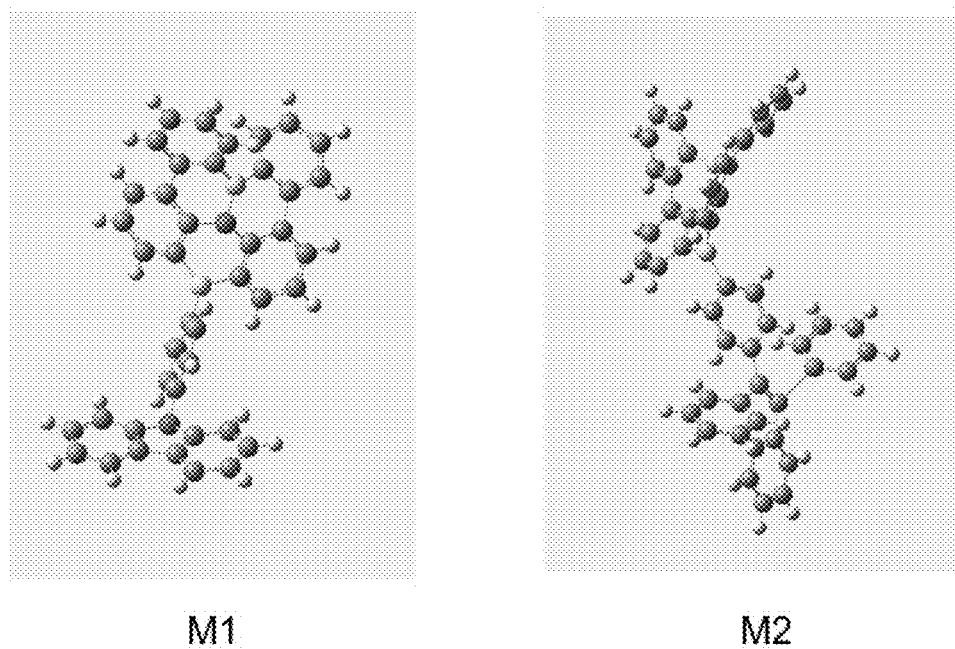
FIG. 2 is molecular structures and 3D ball-and-stick models of boron heterocyclic compounds M1 and M2 according to the present disclosure.
Figure 3:
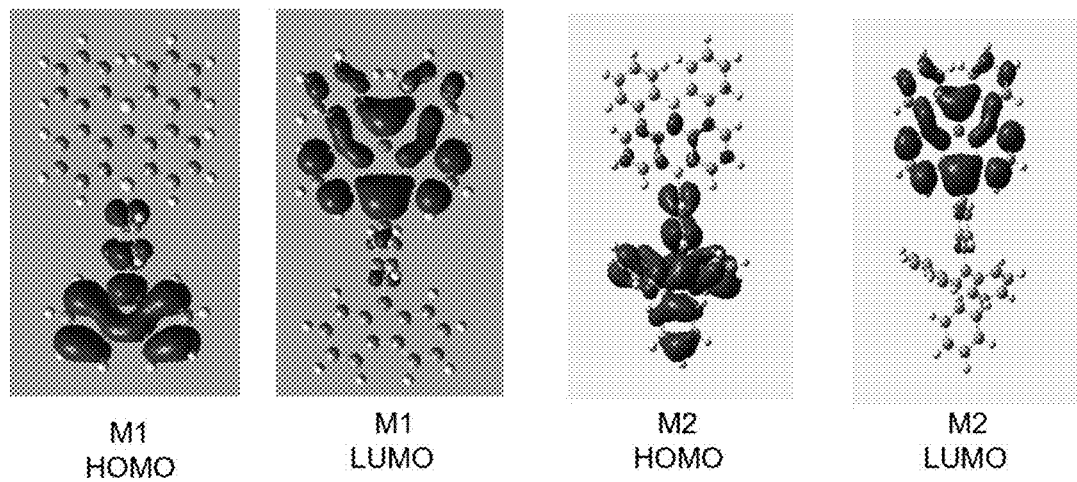
FIG. 3 is a diagram showing HOMO and LUMO energy level distributions of the boron heterocyclic compounds M1 and M2 according to the present disclosure.
Figure 4:
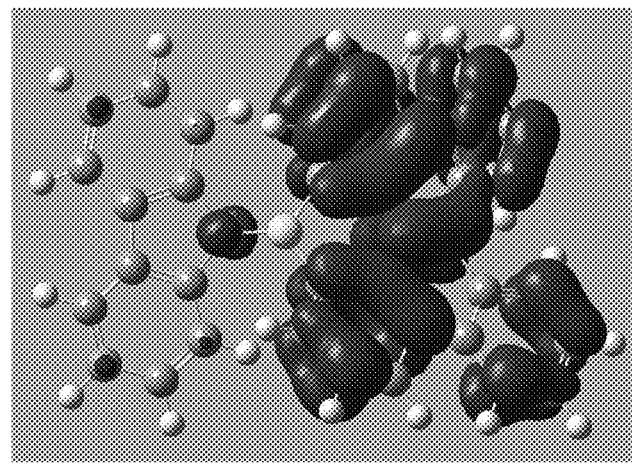
FIG. 4 is a diagram showing the HOMO energy level of a comparative compound M1'.
Figure 5:
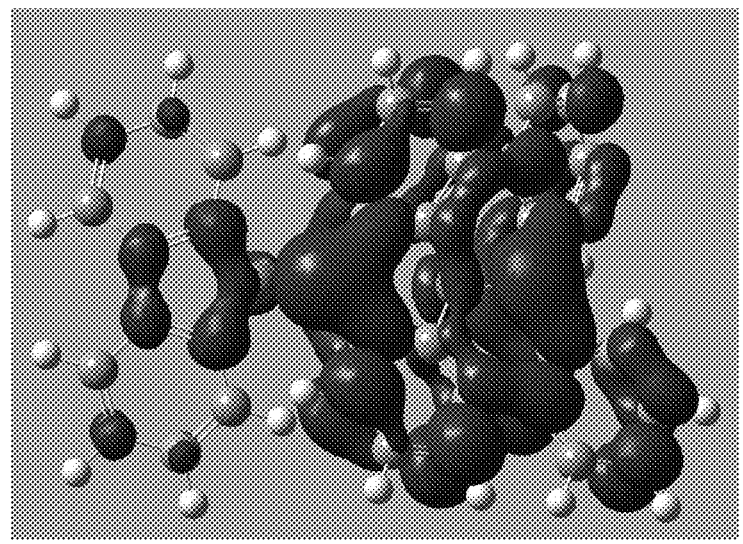
FIG. 5 is a diagram showing a LUMO energy level of the comparative compound M1'.
Figure 6:
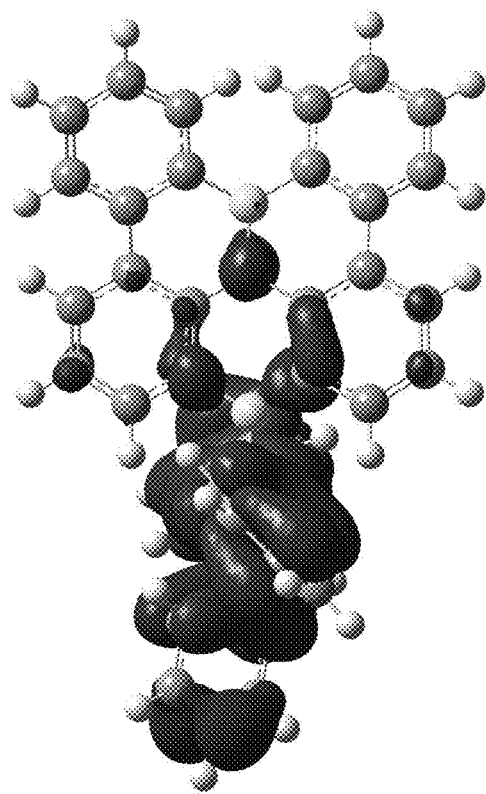
FIG. 6 is a diagram showing a HOMO energy level of a comparative compound M2'.
Figure 7:
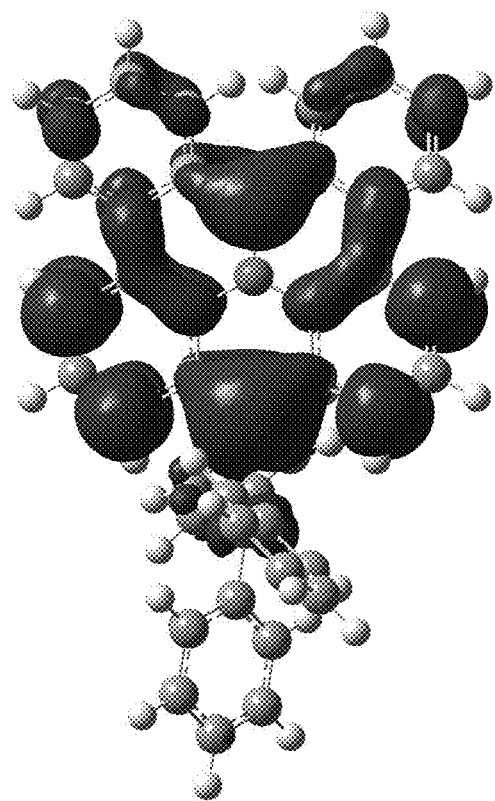
FIG. 7 is a diagram showing the LUMO energy level of the comparative compound M2'.

The chemical structures of the boron heterocyclic compounds prepared in Example 1 and Example 2 were tested and stimulated by means of Gaussian software, and the obtained 3D spatial models are shown in FIG. 2. It can be seen from FIG. 2 that both the donor and the acceptor are substantially perpendicular to the boron heterocyclic ring, and the dihedral angles are 88.15 and 62.17, respectively. The highly twisted structure is advantageous for reducing $\Delta E_{ST}$, thereby improving the reverse intersystem crossing ability.

Similarly, the boron heterocyclic compounds M1-M4, M1' and M2' were simulated by Gaussian software, in which M1' and M2' are compounds obtained by replacing the benzene ring in the M1 and M2 molecules with single bond, respectively. The chemical structures of M1' and M2' are shown below.

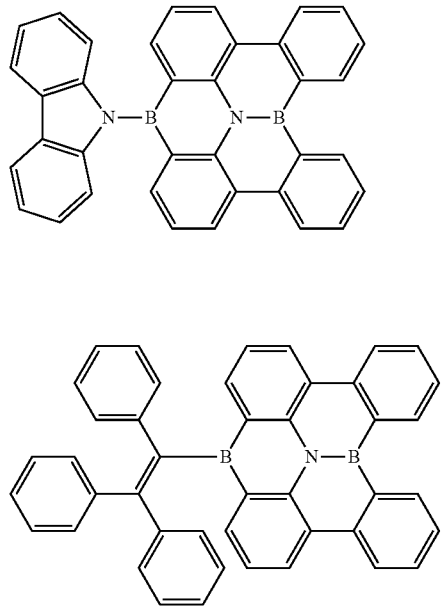

M1'

M2'

The HOMO and LUMO energy level distributions of M1' and M2' are shown in FIG. 4 to FIG. 7.

The test results of the boron heterocyclic compounds M1, M2, M3, and M4 are shown in Table 1.

TABLE 1

| Compound | HOMO (ev) | LUMO (ev) | $S_1$ (ev) | $T_1$ (ev) | $\Delta E_{ST}$ (ev) | τ (μS) |
|---|---|---|---|---|---|---|
| M1 | −5.5 | −2.88 | 2.38 | 2.31 | 0.07 | 7.4 |
| M2 | −5.23 | −2.58 | 2.49 | 2.39 | 0.1 | 2.0 |
| M3 | −5.53 | −2.97 | 2.66 | 2.58 | 0.08 | 5.5 |
| M4 | −5.65 | −2.51 | 2.53 | 2.44 | 0.09 | 2.8 |

It can be seen from Table 1 that the boron heterocyclic compounds M1, M2, M3 and M4 have differences and the separation between HOMO and LUMO, and all have $\Delta E_{ST}$ smaller than 0.2 eV, and thus they are suitable as a TADF material for an OLED device.

FIG. 4 to FIG. 7 show the HOMO and LUMO of M1' and M2'. As can be seen from FIG. 4 to FIG. 7, the HOMO and LUMO energy levels of M1' are not separated, not mention the luminescent properties thereof. Although the HOMO and LUMO energy levels of M2' are separated, the light is emitted in the non-visible region, and $\Delta E_{ST}$ is significantly greater than 0.25 eV, and thus this compound does not have TADF property. Therefore, in view of the synthesis difficulty and the luminescent property, a boron atom is bonded to the benzene ring on the group represented by D.

Another embodiment of the present disclosure provides a display panel including an organic light-emitting device. The organic light-emitting device includes an anode, a cathode, and a light-emitting layer between the anode and the cathode. A light-emitting material of the light-emitting layer includes a host material and a guest material. The guest material is one or more of the boron heterocyclic compounds according to the present disclosure.

According to an embodiment of the display panel of the present disclosure, the organic light-emitting device further includes one or more layers of a hole injection layer, a hole transmission layer, an electron blocking layer, a hole blocking layer, an electron transmission layer or an electron injection layer.

Figure 8:
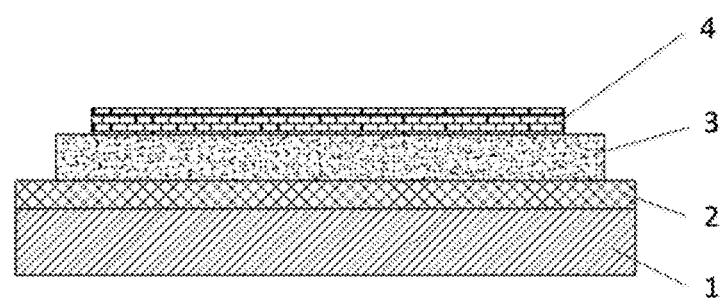
FIG. 8 is a structural schematic diagram of an OLED device according to an embodiment of the present disclosure.

In one embodiment of the display panel of the present disclosure, the organic light-emitting device (such as OLED) has a structure shown in FIG. 8. A substrate made of glass or other suitable material (such as plastic) is denoted with reference number 1; a transparent anode such as ITO or IGZO is denoted with reference number 2 is; an organic film layer, which includes a light-emitting layer, is denoted with reference number 3; a metal cathode is denoted with reference number 4. All of the above constitutes a complete OLED device. The two electrodes 2 and 4 can be interchanged.

In the display panel provided by the present disclosure, the anode of the organic light-emitting device can be made of metal such as copper, gold, silver, iron, chromium, nickel, manganese, palladium, platinum, or alloys thereof. The anode can also be made of metal oxides such as indium oxide, zinc oxide, indium tin oxide (ITO), indium zinc oxide (IZO), or the like. The anode can also be made of a conductive polymer such as polyaniline, polypyrrole, poly (3-methylthiophene), or the like. In addition to the anode materials mentioned above, the anode can also be made of any suitable material known in the related art, or combinations thereof, as long as the material is conductive to hole injection.

In the display panel provided by the present disclosure, the cathode of the organic light-emitting device can be made of metal such as aluminum, magnesium, silver, indium, tin, titanium, or alloys thereof. The cathode also can be made of multiple-layered metal material, such as LiF/Al, LiO$_2$/Al, BaF$_2$/Al, or the like. In addition to the cathode materials listed above, the cathode also can be made of any suitable material known in the related art, or combinations thereof, as long as the material of the cathode is conductive to hole injection.

In the display panel of the present disclosure, the organic light-emitting device can be manufactured by the following steps: forming an anode on a transparent or opaque smooth substrate; forming an organic thin layer on the anode; and further forming a cathode on the organic thin layer. The organic thin layer can be formed with a known method such as vapor deposition, sputtering, spin coating, dipping, ion plating, and the like.

The following Examples 4 and 5 are exemplary for illustrating the practical application of the boron heterocyclic compounds of the present disclosure in organic display panels.

EXAMPLE 4

The anode substrate including an ITO film having a film thickness of 100 nm was ultrasonically washed with distilled water, acetone, and isopropanol, then dried in an oven. The surface was subjected to UV treatment for 30 minutes, and then the substrate was transferred to a vacuum vapor deposition chamber. The vapor deposition of each layer was carried out under a vacuum of $2\times10^{-6}$ Pa. A hole injection layer was formed by depositing 5 nm of PSS. A hole transmission layer (HTL) was then formed by depositing 20 nm of TAPC. The boron heterocyclic compound according to the present disclosure was used as a dopant in the light-emitting layer, 3,3'-bis (N-carbazolyl)-1,1'-biphenyl (mCBP) was used as a host material of the light-emitting layer, the dopant and the host material are vapor deposited at the same time, so as to form a light-emitting having a thickness of 35 nm. Then, an electron transmission layer (ETL) having a thickness of 50 nm was formed by depositing TmPyPb on the light-emitting layer. A LiF layer having a thickness of 2.5 nm and an Al layer having a thickness of 100 nm were deposited on the electron transmission layer sequentially, respectively serving as an electron injection layer (EIL) and a cathode, so as to manufacture an organic light-emitting display apparatus.

EXAMPLE 5

For example, the boron heterocyclic compounds M1 according to the present disclosure was used as fluorescent dopant to design the following light-emitting device D1. The light-emitting device D1 has the following structure:

ITO (100 nm)/PEDOT:PSS (40 nm)/TAPC (20 nm)/mCBP:M1 (35 nm, 8%)/TmPyPb (50 nm)/LiF (2.5 nm)/Al (100 nm).

On basis of the structure of the said light-emitting device, the fluorescent dopant of boron heterocyclic compound M1 in the above-mentioned light-emitting device was replaced with the boron heterocyclic compounds M2, M3 and M4 according to the present disclosure, respectively, so as to design the light-emitting devices D2, D3, and D4.

In contrast, on basis of the structure of the above-described light-emitting device, as a comparative device, the fluorescent dopant of the boron heterocyclic the compound according to the present disclosure was replaced with a comparative compound $M_{ref}$ of $Ir(ppy)_3$.

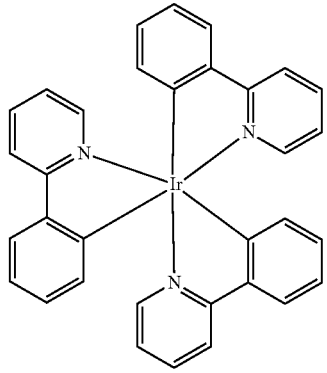

$Ir(ppy)_3$

As described in Example 3, the HOMO and LUMO energy levels of the compounds M1' and M2' are not separated, such that the compounds cannot emit visible light, and cannot be used to manufacture a light-emitting device and to test the luminescent properties of the device for comparing.

The performance data of the light-emitting devices D1, D2, D3, and D4 that contain the boron compounds M1, M2, M3, and M4 according the present disclosure, and the performance data of the comparative device $D_{ref}$ that contains the compound $M_{ref}$ were shown in Table 2.

TABLE 2

| device | doped? | dopant | $V_{turn-on}$ [V] | $E_{L(max)}/E_{L(10\ mA/cm^2)}$ (cd A$^{-1}$) | $h_{p(max)}$ (lm W$^{-1}$) | $EQE_{(max)}$ (%) | CIE (x, y) |
|---|---|---|---|---|---|---|---|
| D1 | Yes | M1 | 2.6 | 39.8/35.9 | 48.0 | 13.5 | (0.32, 0.63) |
| D2 | Yes | M2 | 2.7 | 20.2/16.7 | 23.5 | 8.8 | (0.19, 0.52) |
| D3 | Yes | M3 | 2.7 | 42.8/38.8 | 49.8 | 12.0 | (0.33, 0.62) |
| D4 | Yes | M4 | 3.1 | 19.3/17.4 | 19.3 | 9.7 | (0.18, 0.47) |
| $D_{ref}$ | Yes | M1' | 2.5 | 19.7/18.4 | 24.7 | 4.9 | (0.31, 0.64) |

$V_{turn-on}$: turn-on voltage;
$E_{L\ (10\ mA/cm^2)}$: current efficiency at a current density of 10 mA/cm$^2$;
$h_{p(max)}$: maximum power efficiency;
$EQE_{(max)}$: external quantum efficiency;
CIE (x, y): color coordinate Compared with the comparative device $D_{Ref}$, the light-emitting devices D1, D2, D3, and D4 containing the boron heterocyclic compounds M1, M2, M3, and M4 have much higher current efficiency, power efficiency, and external quantum efficiency than $D_{Ref}$, i.e., having excellent performance. The external quantum efficiency of the light-emitting devices D1, D2, D3, D4 is also higher than that of the light-emitting device $D_{Ref}$.

Yet another embodiment of the present disclosure also provides a display apparatus including the organic light-emitting display panel as described above.

Figure 9:
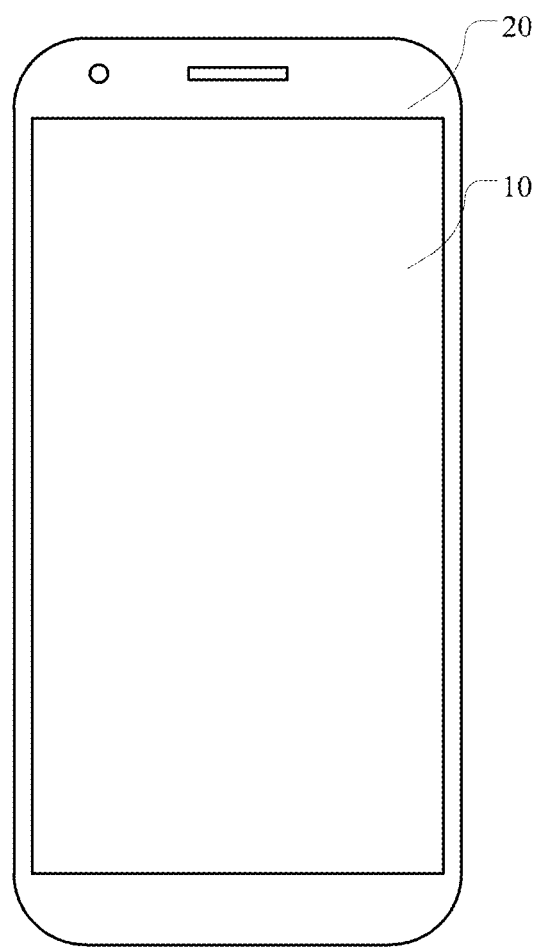
FIG. 9 is a schematic diagram of a display apparatus according to an embodiment of the present disclosure.

In the present disclosure, the organic light-emitting device can be an OLED, which may be used in an organic light-emitting display apparatus. The organic light-emitting apparatus can be a mobile phone display screen, a computer display screen, a liquid crystal television display screen, a smart watch display screen, or a smart car display panel, VR or AR helmet display screen, or display screens of various smart devices. FIG. 9 is a schematic diagram of a display apparatus according to an embodiment of the present disclosure, in which a smart mobile phone is denoted with reference number 20, and mobile phone display screen is denoted with reference number 10.

What is claimed is:

1. A boron heterocyclic compound, having a structure represented by Formula (I):

Formula (I)

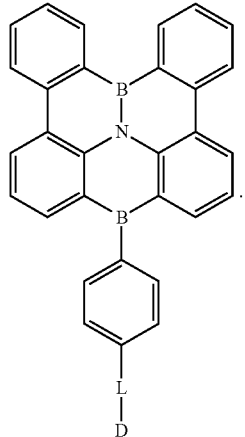

wherein L is

and D is any one of the following groups:

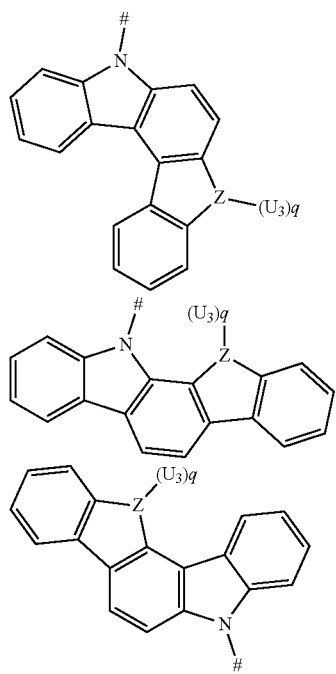

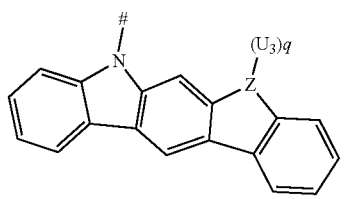

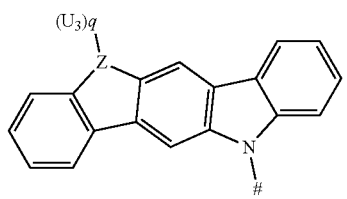

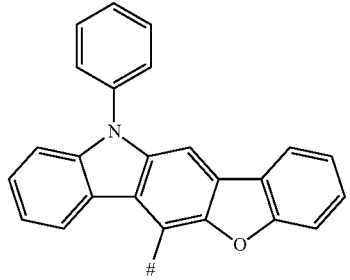

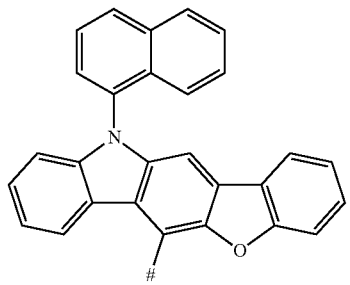

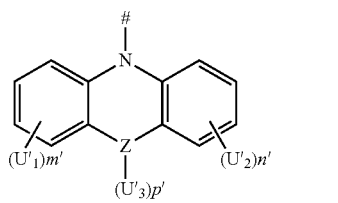

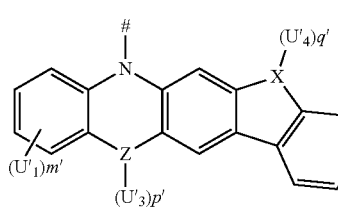

-continued

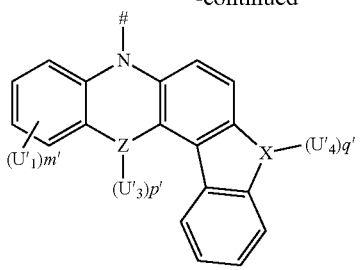

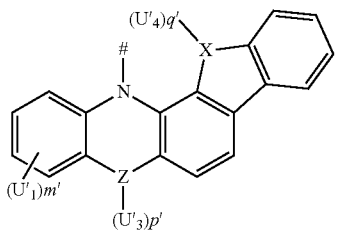

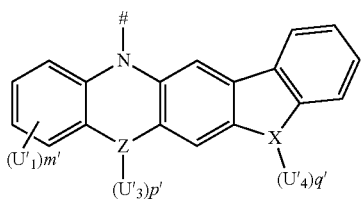

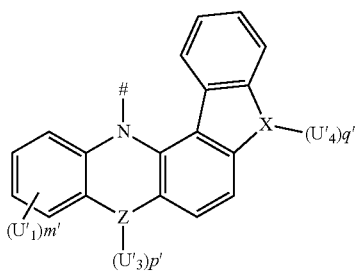

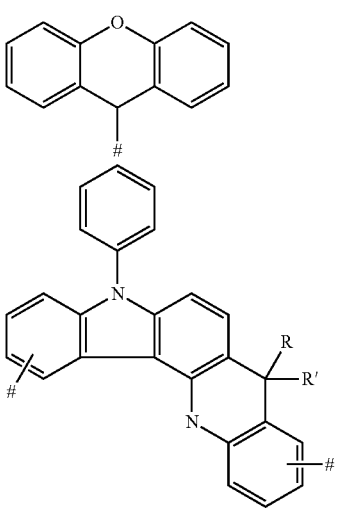

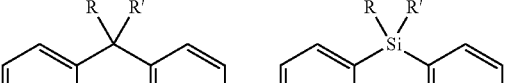

wherein Z' is a C atom, an N atom, an O atom, an S atom, or an Si atom;

$U'_1, U'_2, U'_3$, and $U'_4$ are each independently selected from the group consisting of, C1-C6 alkyl and C6-C12 aryl;

m' and n' are 0; and p' and q' are 0, 1 or 2;

when Z' or X' is an oxygen atom or a sulfur atom, p' and q' are 0;

wherein Z is a C atom, an N atom, an O atom or an S atom;

$U_3$ is selected from the group consisting of a hydrogen atom, C1-C6 alkyl, and C1-C6 alkoxy;

q is 0, 1 or 2;

when Z is an oxygen atom or a sulfur atom, q is 0;

wherein R and R' are each independently selected from the group consisting of a hydrogen atom, C1-C4 alkyl, and phenyl;

and indicates a bonding position.

2. The boron heterocyclic compound according to claim 1, wherein D is any one of the following groups:

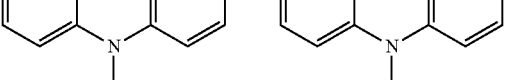

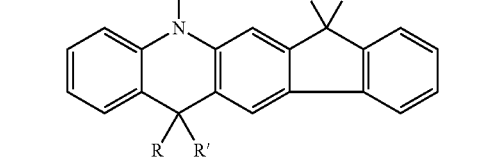

-continued

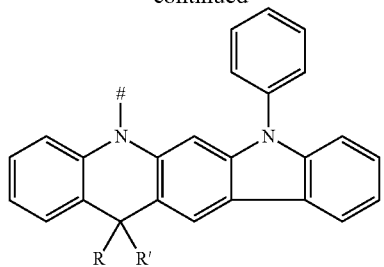

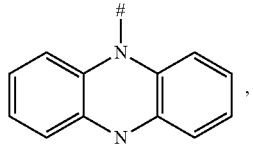
, wherein R and R' are each independently selected from the group consisting of a hydrogen atom, C1-C4 alkyl, and phenyl.

3. The boron heterocyclic compound according to claim 1, wherein an energy difference $\Delta E_{st}$ between a lowest singlet energy level S1 of the boron heterocyclic compound and a lowest triplet energy level T1 of the boron heterocyclic compound satisfies: $\Delta E_{st}=E_{S1}-E_{T1} \leq 0.20$ eV.

4. A display panel, comprising an organic light-emitting device,
wherein the organic light-emitting device comprises an anode, a cathode, and a light-emitting layer disposed between the anode and the cathode,
a light-emitting material of the light-emitting layer comprises a host material and a guest material, wherein the guest material is one or more of the boron heterocyclic compounds according to claim 1.

5. The display panel according to claim 4, wherein the organic light-emitting device further comprises one or more layers selected from a hole injection layer, a hole transmission layer, an electron blocking layer, a hole blocking layer, an electron transmission layer or an electron injection layer.

6. A display apparatus, comprising the display panel according to claim 4.

7. A boron heterocyclic compound selected from the following compounds:

M2

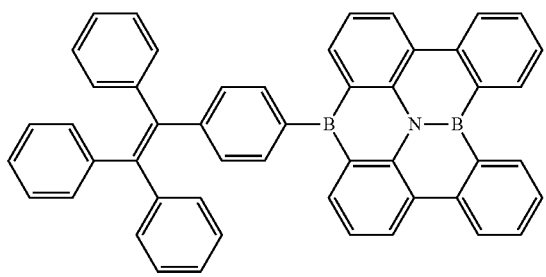

M3

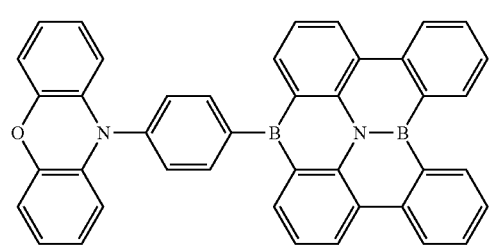

M4

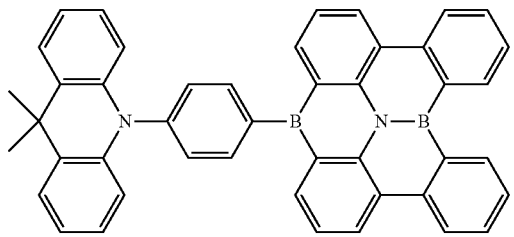

M5

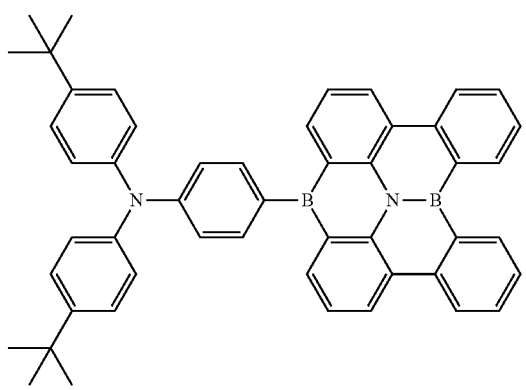

M6

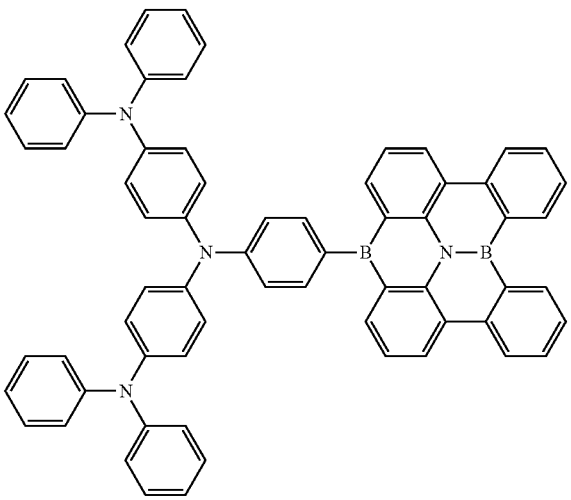

M7

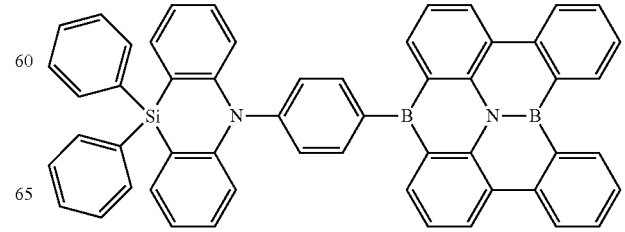

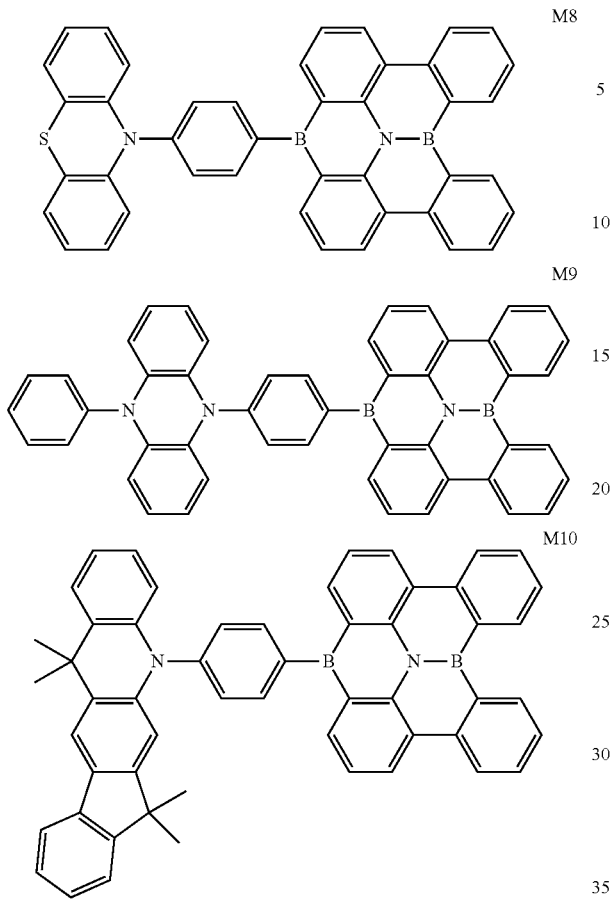
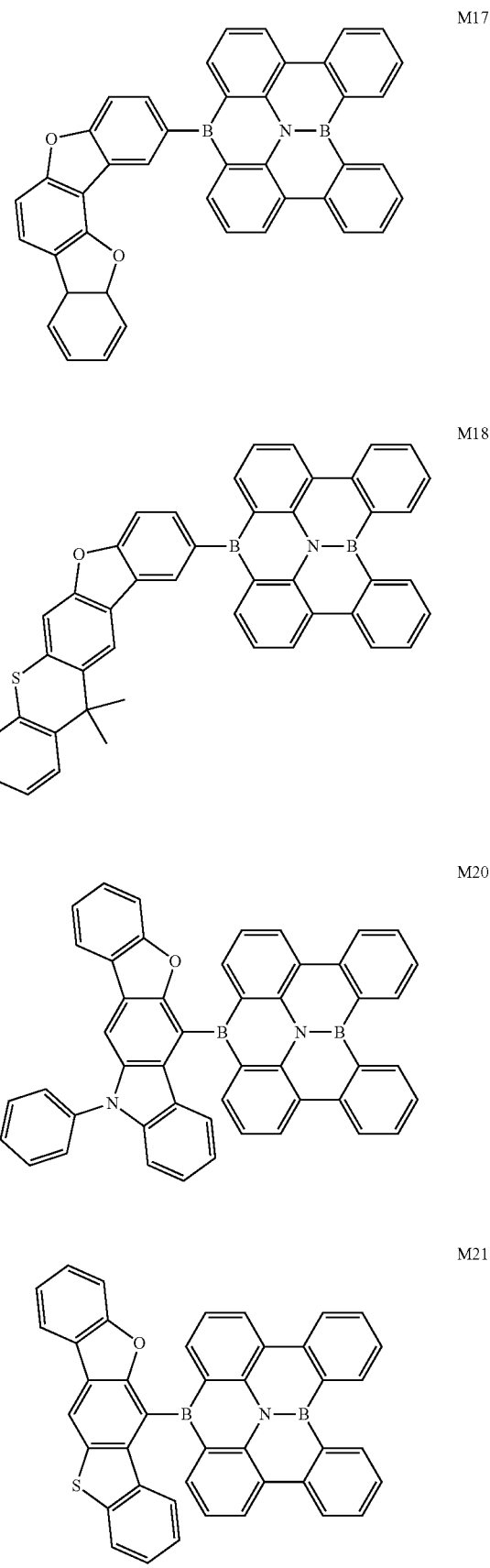

-continued
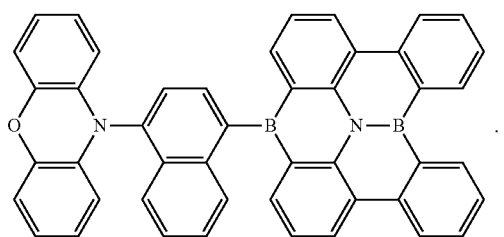
M23
* * * * *